(12) United States Patent
Lorito et al.

(10) Patent No.: US 11,843,069 B2
(45) Date of Patent: Dec. 12, 2023

(54) SEMICONDUCTOR DETECTOR AND METHOD OF FABRICATING SAME

(71) Applicant: ASML Netherlands B.V., Veldhoven (NL)

(72) Inventors: Gianpaolo Lorito, Veldhoven (NL); Stoyan Nihtianov, Eindhoven (NL); Xinqing Liang, Santa Cruz, CA (US); Kenichi Kanai, Palo Alto, CA (US)

(73) Assignee: ASML Netherlands B.V., Veldhoven (NL)

(*) Notice: Subject to any disclaimer, the term of this patent is extended or adjusted under 35 U.S.C. 154(b) by 807 days.

(21) Appl. No.: 16/703,294

(22) Filed: Dec. 4, 2019

(65) Prior Publication Data

US 2020/0212246 A1    Jul. 2, 2020

Related U.S. Application Data

(60) Provisional application No. 62/927,451, filed on Oct. 29, 2019, provisional application No. 62/786,865, filed on Dec. 31, 2018.

(51) Int. Cl.
*H01L 31/115* (2006.01)
*H01J 37/244* (2006.01)
*H01J 37/28* (2006.01)

(52) U.S. Cl.
CPC .......... *H01L 31/115* (2013.01); *H01J 37/244* (2013.01); *H01J 37/28* (2013.01); *H01J 2237/2441* (2013.01)

(58) Field of Classification Search
CPC ....... H01L 31/115; H01J 37/244; H01J 37/28; H01J 37/2441; H01J 2237/2441
See application file for complete search history.

(56) References Cited

U.S. PATENT DOCUMENTS 6,329,218 B1 * 12/2001 Pan .................... H01L 27/1463
                                                                    438/57
6,566,722 B1     5/2003 Lin et al.
(Continued)

FOREIGN PATENT DOCUMENTS

EP    2 194 565 A1    6/2010
EP    2 346 094 A1    7/2011
(Continued)

OTHER PUBLICATIONS

Sakic et al., "High-Efficiency Silicon Photodiode Detector for Sub-keV Electron Microscopy", IEEE Transactions on Electron Devices, vol. 59, No. 10, Oct. 2012 (Year: 2012).*
(Continued)

*Primary Examiner* — David E Smith
(74) *Attorney, Agent, or Firm* — FINNEGAN, HENDERSON, FARABOW, GARRETT & DUNNER, LLP

(57) ABSTRACT

The present disclosure describes a detector used in critical dimension scanning electron microscopes (CD-SEM) and review SEM systems. In one embodiment, the detector includes a semiconductor structure having a p-n junction and a hole through which a scanning beam is passed to a target. The detector also includes a top electrode for the p-n junction (e.g., anode or cathode) that provides an active area for detecting electrons or electromagnetic radiation (e.g., backscattering from the target). The top electrode has a doped layer and can also have a buried portion beneath the doped layer to reduce a series resistance of the top electrode without changing the active area. In another embodiment, an isolation structure can be formed in the semiconductor structure near sidewalls of the hole to electrically isolate the active area from the sidewalls. A method for forming the buried portion of the top electrode is also described.

15 Claims, 18 Drawing Sheets

(56) References Cited

U.S. PATENT DOCUMENTS

| | | | |
|---|---|---|---|
| 8,426,831 | B2 | 4/2013 | Nihtianov et al. |
| 8,450,820 | B2 | 5/2013 | Nanver et al. |
| 9,331,117 | B2 | 5/2016 | Nihtianov et al. |
| 2016/0056015 | A1* | 2/2016 | van Veen ............ H01L 27/1461 250/440.11 |

FOREIGN PATENT DOCUMENTS

| | | | | |
|---|---|---|---|---|
| EP | 2346094 | A1 * | 7/2011 | ............ H01J 37/244 |
| JP | 2003-282017 | | 10/2003 | |
| JP | 2003282017 | A * | 10/2003 | |
| TW | 201621963 | A | 6/2016 | |

OTHER PUBLICATIONS

A. Šakić et al.; "Versatile Silicon Photodiode Detector Technology for Scanning Electron Microscopy with High-Efficiency Sub-5 keV Electron Detection"; IEEE 2010 pp. 712-715 (4 pgs.).

A. Šakić et al.; "High-Efficiency Silicon Photodiode Detector for Sub-ke V Electron Microscopy"; IEEE Transactions on Electron Devices, vol. 59, No. 10, Oct. 2012; pp. 2707-2714 (8 pgs.).

A. Šakić et al.; "PureB Low-Energy Electron Detectors with Closely-Packed Photodiodes Integrated on Locally-Thinned High-Resistivity Silicon"; IEEE 2012 (4 pgs.).

L. Shi et al.; "Comparative Study of Silicon-Based Ultraviolet Photodetectors"; IEEE Sensors Journal, vol. 12, No. 7, Jul. 2012; pp. 2453-2459 (7 pgs.).

L. Shi et al.; "Electrical Performance Optimization of a Silicon-Based EUV Photodiode With Near-Theoretical Quantum Efficiency" IEEE 2011; Transducers '11, Beijing China, Jun. 5-9, 2011; pp. 48-51 (4 pgs.).

T. Knežević et al.; "Silicon Drift Detectors with the Drift Field Induced by PureB-Coated Trenches"; Photonics2016,3,54;doi:10.3390/photonics30400; www.mdpi.com/journal/photonics (18 pgs).

Chinese Office Action issued by the Intellectual Property Office (IPO) in related Chinese Application No. 108146147 (12 pgs.).

The International Search Report and Written Opinion issued by the International Searching Authority in related International Application No. PCT/EP2019/083988 (15 pgs.).

Notification of Reason(s) for Refusal issued in related Korean Patent Application No. 10-2021-7019390; dated Feb. 28, 2023 (12 pgs.).

* cited by examiner

SEMICONDUCTOR DETECTOR AND METHOD OF FABRICATING SAME

CROSS-REFERENCE TO RELATED APPLICATIONS

This application claims priority of U.S. application 62/786,865 which was filed on Dec. 31, 2018, and U.S. application 62/927,451 which was filed on Oct. 29, 2019, which are incorporated herein in its entirety by reference.

FIELD

The present disclosure relates generally to radiation detectors such as may be used, for example, in scanning electron microscope (SEM) systems.

BACKGROUND

Radiation detectors are used in a variety of applications. Here and elsewhere, the term "radiation" is used to refer to electromagnetic waves and moving particles. For example, in manufacturing processes used to make integrated circuit (IC) components, unfinished or finished circuit components are inspected to ensure that they are manufactured according to a specified design and are free of defects. Inspection systems utilizing optical microscopes or charged particle (e.g., electron) beam microscopes, such as SEMs, can be employed. As the physical sizes of the various features of IC components continue to shrink, the accuracy and yield achieved by these inspections systems becomes more important. Currently, these systems tend to be at least partially limited by the sensitivity and speed of the semiconductor radiation detectors, or simply semiconductor detectors, used to detect the backscattered or secondary electrons coming from a target being inspected. Accordingly, improvements in the performance of the semiconductor detectors is highly desirable.

SUMMARY

The following presents a simplified summary of one or more aspects of various embodiments of the disclosure in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Aspects of an embodiment describe a detector having a semiconductor structure with a hole through which a scanning beam is passed to a target, where the semiconductor structure includes a p-n junction. The detector also has a top electrode for the p-n junction, where the top electrode provides an active area for detecting electrons or electromagnetic radiation, where the top electrode includes a doped layer and a buried portion beneath the doped layer, and where the buried portion is configured to reduce a series resistance of the top electrode without changing the active area provided for detection.

Aspects of another embodiment describe a detector having a semiconductor structure with a hole through which a scanning beam is passed to a target, where the semiconductor structure includes a p-n junction. The detector also has a top electrode for the p-n junction, where the top electrode provides an active area for detecting electrons or electromagnetic radiation, and where the top electrode includes a doped layer. The detector also has an isolation structure formed in the semiconductor structure near sidewalls of the hole, where the isolation structure is configured to electrically isolate the active area from the sidewalls of the hole.

Aspects of yet another embodiment describe a detector having a semiconductor structure with a hole through which a scanning beam is passed to a target, where the semiconductor structure includes a p-n junction. The detector also has a top electrode for the p-n junction, where the top electrode provides an active area for detecting electrons or electromagnetic radiation, where the top electrode includes a doped layer and a buried portion beneath the doped layer, and where the buried portion is configured to reduce a series resistance of the top electrode without changing the active area provided for detection. The detector also has an isolation structure formed in the semiconductor structure near sidewalls of the hole, where the isolation structure is configured to electrically isolate the active area from the sidewalls of the hole.

Aspects of yet another embodiment describe a method of forming a buried portion of a top electrode in semiconductor detector, the method including depositing a dopant layer on a surface of a semiconductor structure having an active area of the top electrode, and then applying a thermal treatment to drive dopants from the dopant layer into the semiconductor structure and underneath a detecting layer of the top electrode to form the buried portion of the top electrode.

According to another aspect of another embodiment, there is disclosed a method of making a semiconductor detector comprising an element for generating an electrical signal in response to receiving radiation and circuitry electrically connected to the element, the circuitry including at least one structure incapable of withstanding a processing temperature in excess of a temperature T, the method comprising the steps of fabricating a first portion of the circuitry, the first portion being capable of withstanding the temperature T, performing a processing step at the temperature T, and fabricating a second portion of the circuitry, the second portion including structures incapable of withstanding the temperature T. Performing a processing step at the temperature T may comprise performing high temperature chemical vapor deposition. Performing high temperature chemical vapor deposition may comprise performing high temperature chemical vapor deposition of boron. Performing high temperature chemical vapor deposition of boron may comprise high temperature chemical vapor deposition of pure boron. Fabricating a first portion of the circuitry may comprise partial fabrication of CMOS circuitry. Fabricating a second portion of the circuitry comprises completing fabrication of CMOS circuitry. The temperature T may be above 700° C.

According to another aspect of another embodiment, there is disclosed a method of making a semiconductor detector, the detector comprising an element for generating a signal in response to receiving radiation and CMOS circuitry electrically connected to the element including at least one structure incapable of withstanding a processing temperature T in excess of 700° C., the method comprising the steps of fabricating a first portion of the CMOS circuitry, the first portion being capable of withstanding the temperature T, performing an HT PureB CVD processing step at the temperature T, and fabricating a second portion of the CMOS circuitry, the second portion including structures incapable of withstanding the temperature T.

According to another aspect of another embodiment, there is disclosed a process for making a single-die image semiconductor radiation detector, the process comprising the steps of providing a starting wafer, performing a first partial circuit formation step on a processed side of the starting wafer to form a first partial circuit layer, the first partial circuit formation step being limited to formation of circuitry capable of withstanding a processing temperature T, bonding a first bonding wafer to the first partial circuit layer, etching away a portion of the starting wafer to expose the first partial circuit layer, depositing a layer of boron on the first partial circuit layer, bonding a second bonding wafer to the boron layer, debonding the first bonding wafer from the first partial circuit layer, performing a second partial circuit formation step on first partial circuit layer to form a completed circuit layer, the second partial circuit formation step comprising forming circuit structures incapable of withstanding the processing temperature T, bonding a third bonding layer to the completed circuit layer, and debonding the second bonding wafer from the boron layer. Performing a first partial circuit formation step may comprise performing a first partial CMOS circuit formation step. Performing a second partial circuit formation step on the first partial circuit layer to form a completed circuit layer may comprise performing a second partial CMOS circuit formation step on the first partial circuit layer to form a completed the CMOS circuit layer. Depositing a layer of boron on the first partial circuit layer comprises using HT PureB CVD. The temperature T may be above 700° C.

According to another aspect of another embodiment, there is disclosed a single-die semiconductor detector comprising an element for generating a signal in response to receiving radiation and CMOS circuitry electrically connected to the element, the CMOS circuitry including at least one structure incapable of withstanding a processing temperature T in excess of 700° C., the detector being fabricated by a method comprising the steps of fabricating a first portion of the CMOS circuitry, the first portion being capable of withstanding the temperature T, performing an HT PureB CVD processing step at the temperature T, and fabricating a second portion of the CMOS circuitry, the second portion including structures incapable of withstanding the temperature T.

To accomplish the foregoing and related ends, aspects of embodiments comprise the features hereinafter described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

As mentioned above, inspection systems utilizing optical microscopes or charged particle (e.g., electron) beam microscopes, such as SEMs, can be employed for the inspection of finished or unfinished IC components (e.g., semiconductor wafer or die inspection). As the critical dimensions of the IC components continue to shrink, resulting in ever increasing numbers of transistors, and with the overall throughput of the inspection systems also being pushed higher, the accuracy, yield, and speed achieved by these inspections systems becomes more important. One of the key components of these systems is a semiconductor detector used to profile any errors or inconsistencies resulting from the manufacturing process by detecting the backscattered or secondary electrons coming from the target being inspected. With higher throughput, a semiconductor detector that is more sensitive or faster may help to ensure that sufficient information is detected at higher speeds. A semiconductor detector that has improved sensitivity or higher bandwidth, or other features described herein, may enable an improvement in accuracy, yield, or speed in the inspection systems. This disclosure describes various techniques, such as techniques for improving the sensitivity of the semiconductor detector by, for example, increasing its active area, or for improving the bandwidth of the semiconductor detector by, for example, reducing its series resistance to shorten its time constant.

Reference will now be made in detail to example aspects of embodiments, examples of which are illustrated in the accompanying drawings. The following description refers to the accompanying drawings in which the same numbers in different drawings represent the same or similar elements unless otherwise represented. The implementations set forth in the following description of example aspects of embodiments do not represent all implementations consistent with the disclosure. Instead, they are merely examples of structures and processes consistent with aspects of embodiments related to the disclosure as recited in the claims. For example, although some aspects of the disclosure are describe in the context of inspection systems that use electron scanning and detection, however, these aspects may also be applicable to other types of inspection systems.

Figure 1A:
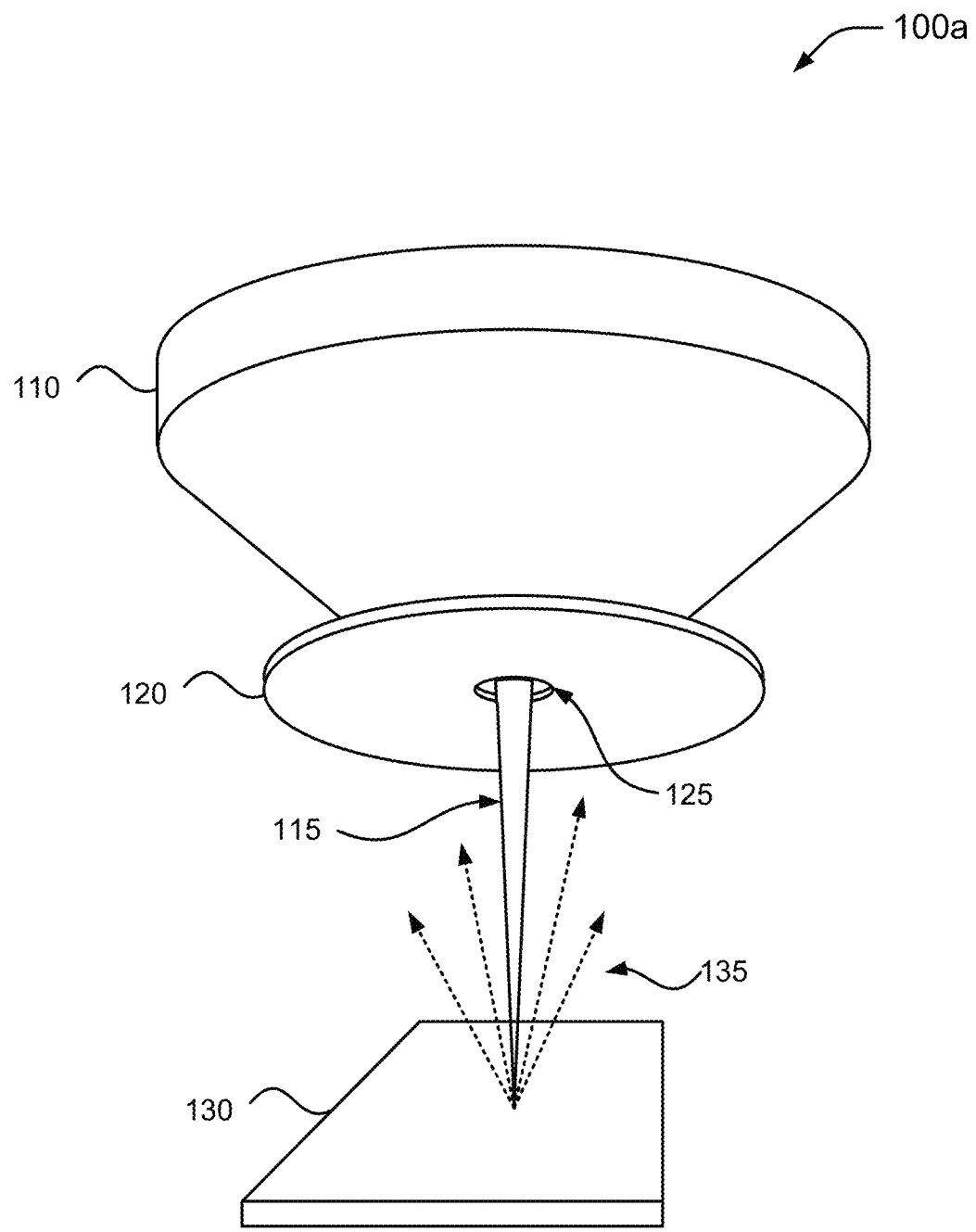
FIG. 1A is a diagram illustrating a semiconductor detector in an SEM system.

FIG. 1A shows a diagram 100a illustrating a general representation of an SEM system (e.g., inspection system). An SEM system may also be referred to as an electron beam system ore-beam system. The diagram 100 includes a source 110 that provides a scanning beam 115 (e.g., an electron beam), the scanning beam 150 passing through a hole 125 of a detector 120 (e.g., a semiconductor detector) and aimed at a target 130 (e.g., wafer or die being inspected). The hole 125 can be located in the center of the detector 120, or at some other location of the detector 120. Because of the alignment of the detector 120 between the source 110 and the target 130, the detector 120 may be referred to as an in-lens detector. An axis formed by the positioning of the source 110 and the detector 120 along the vertical direction may be referred to as an optical axis of the SEM system.

The scanning beam 150 is used to characterize one or more features on a top surface of the target 130, resulting in backscattered or secondary electrons 135 that reach a down-facing surface of the detector 120 for detection. Based on the electrons 135 received by the detector 120, the detector 120 can then generate and provide a signal (not shown) that conveys information associated with the inspected features of the target 130, where this information is subsequently used to produce SEM images of the scanned target. In some implementations more than one scanning beam 150 may be generated and provided by the source 110 to allow for the inspection of multiple targets.

Figure 1B:
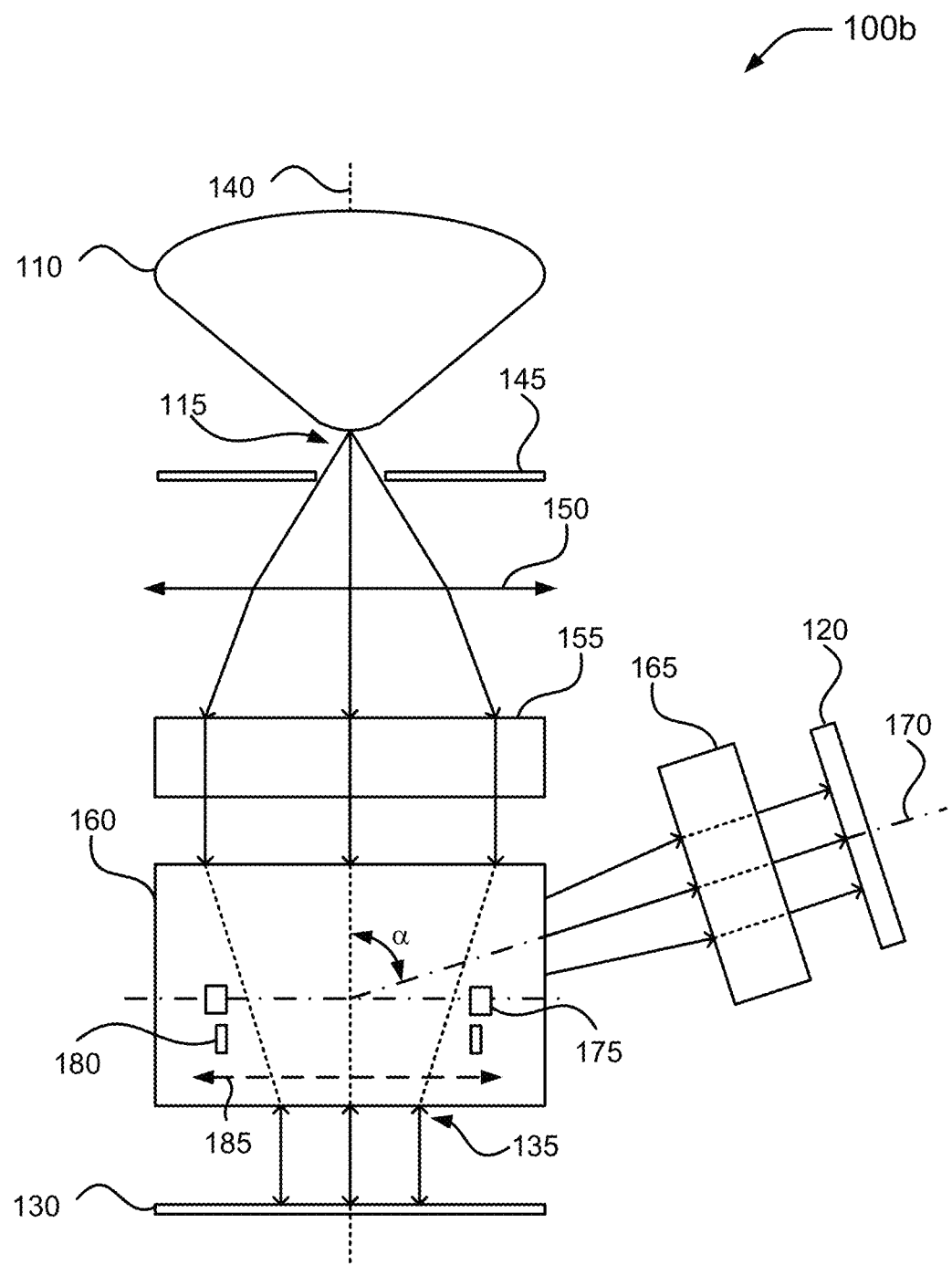
FIG. 1B is a diagram illustrating a semiconductor detector in an off-axis SEM system.

FIG. 1B shows a diagram 100b illustrating a general representation of an off-axis SEM system. In this example, the detector 120 can be placed in a secondary axis 170 that is different from a primary axis 140 of the scanning beam 115. In such a case, the detector 120 can be referred to as an off-axis detector and need not have the hole 125 for the scanning beam 115 to pass through.

The SEM system shown in the diagram 100b also includes the source 110 (or similar electron or radiation source), a gun aperture plate 145, a condenser lens 150, a source conversion unit 155, a primary projection system 160, and the target 130, all of which are aligned with the primary axis 140. A beam separator 175 and a deflection scanning unit 180 may be placed inside the primary projection system 160. The primary projection system 160 may also include an objective lens 185. The SEM system in the diagram 100b also includes a secondary imaging system 165 that is aligned, along with the detector 120, with the secondary axis 170.

The beam separator 175 may be configured to deflect secondary electrons 135 (e.g., or beams with the secondary electrons 135) by an angle α in the direction of the secondary imaging system 165. An angle α may be determined as the angle between the primary axis 140 and the secondary axis 170, as such, the angle α may represent the separation angle between the on-axis scanning beam 115 and the secondary electrons 135 that are directed by the beam separator 175 in the direction of the secondary imaging system 165 and the off-axis detector 120. In some implementations, the angle α may be set within a range of 5 to 25 degrees.

The current in-lens or off-axis detector 120 can be a secondary electron (SE) detector that includes a single silicon PIN photodiode about 20 millimeters (mm) in diameter with the hole 125 being about 0.5 mm in diameter to let a primary electron beam pass through (e.g., the scanning beam 115). In this disclosure, the terms "about" or "approximately", when used, may refer to a value relative to a nominal value, where the difference between these two values can be less than 1%, between 1% and 5%, between 1% and 10%, or between 1% and 20%.

There is typically an aluminum (Al) coating of about 50 nanometers (nm) on top of the PIN photodiode surface to improve the series resistance as well as reflecting any stray light (e.g., a light coming from a laser and scattered inside a column of the SEM system).

The use of a semiconductor detector for the detector 120 (e.g., a single silicon PIN photodiode) has been dominantly used as an in-lens detector for electron beam (e-beam) wafer inspection systems. On the other hand, an Everhart-Thornley detector (E-T-detector) consisting of scintillator and a photomultiplier (PMT) tub has been used for critical dimension SEM (CD-SEM) and review SEM systems. By using semiconductor detectors instead of E-T detectors, wafer inspection systems can generally operate at high inspection throughputs with 10 to 100 times higher beam current and a high detection bandwidth for imaging. Thus, semiconductor detectors were a natural choice for their superior bandwidth and robustness against radiation damage even though they may have a relatively higher noise floor than E-T detectors.

With the ever-continuing miniaturization of semiconductor wafer design (e.g., the reduction in critical dimensions or CDs), even e-beam wafer inspection systems are now often operated at very low beam current for securing the necessary resolution of the SEM images. As this trend continues, the noise floor of the semiconductor detectors used for the SEM scanning will have to be lowered in order to keep SNR from overwhelming the small output current produced by semiconductor detector.

In typical wafer inspection systems, a retarding objective lens SEM column configuration is used in which the wafer being inspected (e.g., the target 130) is biased to a negative high voltage at Vw, to achieve a landing energy (Vle) of V volts in keeping with the expression shown below:

$$Vle = Vc - Vw,$$

where Vc is acceleration voltage of the electron beam cathode. Secondary electrons (e.g., the electrons 135) emitted from the wafer surface in response to the scanning beam 115 are accelerated to (Vc−Vw) eV and hit the surface of the detector 120 with such kinetic energy.

In one example, the cathode voltage Vc can be −10 kilovolts (KV) or larger such that the kinetic energy of the electrons incoming to the detector 120 (e.g., the electrons 135) is kept minimally above 8 KeV. The electrons coming to the surface of the detector 120 have to reach a depletion region passing through a p++ layer and an n-p junction thickness as well as the top aluminum coating used to reflect scattered photons. If the electron kinetic energy goes down below 8 KeV, quantum efficiency steeply goes down, as the variation of the signal current per electron decreases, deteriorating the SNR of the SEM image. There may be instances, however, that for specific needs in constructing the SEM system as well as system reliability and cost, it is desirable to keep the cathode voltage below 6 KV. In those situations, it may be necessary for the detector 120 to allow most of the incoming electrons to reach the depletion region with minimum energy loss in order to minimize the SEM image SNR degradation.

While off-axis detectors (e.g., the detector 120 in the secondary axis in the diagram 100b of FIG. 1B) need not have a hole, in-lens or on-axis detectors (e.g., the in-lens detector 120 in the diagram 100a of FIG. 1A) needs a hole (e.g., the hole 125) for the primary electron beam (e.g., the scanning beam 115) to pass through, where the distance between the hole inside diameter (ID) surface and the active detection surface has to be designed properly, such that additional dark current is minimized.

As mentioned above, the detector of an e-beam inspection system needs to support high bandwidth for high inspection throughput, where a relatively larger beam current is employed. The bandwidth of the detector depends at least in part on the junction capacitance and the series resistance. Therefore, if a retarding objective lens SEM column is to be used with a cathode voltage fixed at a low value such as 6 KV, it is desirable to reduce or lower the series resistance to provide a shorter time constant for the in-lens detector (e.g., faster response, higher bandwidth) without reducing the probability that an electron that reaches the surface of the detector also reaches the depletion region to maintain a high quantum efficiency.

For CD-SEM applications, there are a few challenges related to the detector design which need to be resolved. For CD-SEM applications, a low beam or probing current is needed to maintain good resolution, which results in a very low total beam dosage. In this situation having a very low circuit noise level is needed to maintain an acceptable SNR and therefore a good image quality. The noise performance of existing PIN photodiode detectors in combination with a preamp circuit does not meet these requirements. In current preamp designs, the detector capacitance is an important factor not only affecting the bandwidth, but also the noise.

To address at least some of these issues, a thin layer can be added to the detector to improve collection efficiency. In some implementations, this thin layer includes boron (B), and a detector with the boron layer can be referred to as a pure-B detector. The boron layer is typically a few nanometers of pure or almost pure amorphous boron. Layers that use other elements in pure or almost pure form and provide similar functionality to that of a pure-boron layer can also be used. Such a detector, however, still has to meet the low capacitance and fast response time requirements. Because of the low beam or probing current, the low landing energy, and the high bandwidth request, the corresponding signal produced by the detector 120 (e.g., secondary electron or SE electron) is much lower than in existing platforms. So it is desirable to keep the detector's collection efficiency as high as possible—the proposed boron layer in the pure-B detector meets this issue thanks to the boron layer's unique design characteristics—and to maximize the fill factor (e.g., the detecting or active area of the detector) by reducing any unused or dead area, which may include any "safety margin" of the active area to an edge of the hole 125 and any isolation areas between different segments of the detector.

In some instances, the secondary or backscattered electrons coming out of the top surface of the target 130 will be accelerated back by a field of about 5 KeV field along the optical axis. The spatial distribution of the secondary electrons on the surface of the detector 120 is approximately Gaussian in shape (see e.g., FIG. 3), even though the spread out of the curve depends on the running conditions, the distribution centered on the optical axis. To increase the signal power, thus improving the SNR, it would be preferable to have the dead area be as small as possible while still maintaining low leakage current.

An aspect of using a pure boron layer as applied to the electron detection is the high sheet resistance of the nanometer-thin boron layer (e.g., in the order of 10 k$\Omega$×cm). For fast-response electron detectors, a low series resistance on a top electrode (e.g., anode) is generally preferred so that together with a low capacitance per unit area faster response times can be achieved. Current solutions to reduce the series resistance of a pure B layer on a top electrode is to form an aluminum (Al) grid on top of the boron layer (see e.g., FIG. 2A), which results in a loss of active area since the electrons landing on the aluminum grid will not make it to the depletion region and will not be detected. The aluminum grid also creates a topography on the active area which may disturb the detection of the incoming electrons.

Figure 2A:
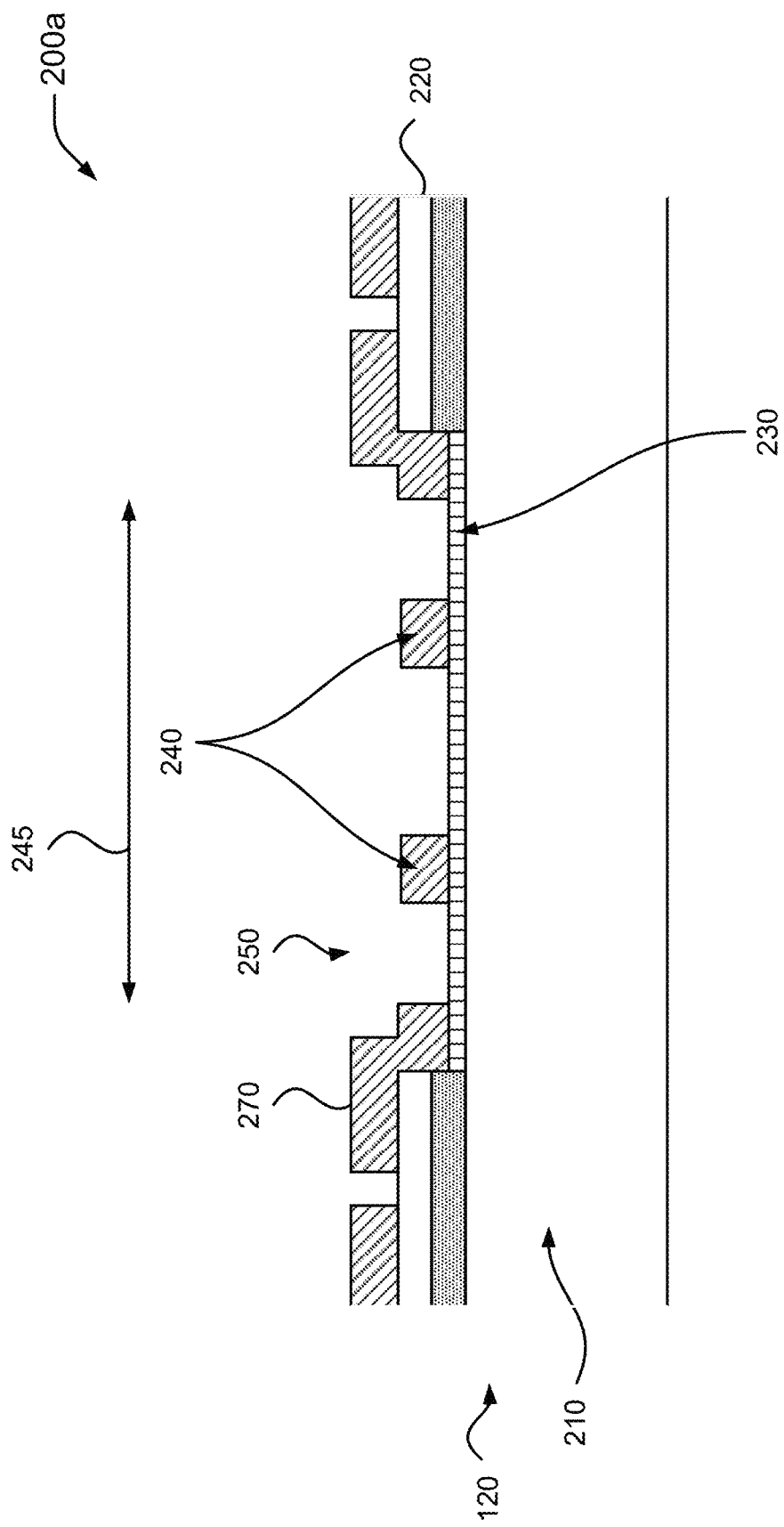
FIG. 2A is a diagram illustrating a partial cross-sectional view of a semiconductor detector with an external Al grid on a top electrode, according to some aspects of the present disclosure.

FIG. 2A shows a diagram 200a that illustrates a partial cross-sectional view of a semiconductor detector (e.g., the detector 120) with an external aluminum (Al) grid 240 on a top electrode 250. The semiconductor detector can be an in-lens/on-axis semiconductor detector (see e.g., FIG. 1A) or an off-axis semiconductor detector (see e.g., FIG. 1B). In the diagram 200a, the detector 120 includes a semiconductor structure 210 (e.g., a silicon-based photodiode) and the top electrode 250. The semiconductor structure 210 can be a high resistivity (HR) semiconductor layer and includes a p-n junction (not shown) that produces a depletion region (not shown). The p-n junction can be a p-i-n junction to form a PIN photodiode in the semiconductor structure 210. Also shown in FIG. 2A is an isolation layer 220 between the top electrode 250 and the semiconductor structure 210.

The top electrode 250 provides an active area 245 for detecting electrons (or electromagnetic radiation). That is, top electrode 250 is placed on the surface of the detector 120 that faces the target 130 and receives the secondary or backscattered electrons 135 from the target 130. The top electrode 250 includes a doped layer 230, which can be referred to as a detecting layer, than can be doped with pure boron to provide the boron layer discussed above for improving the collection efficiency of the detector 120.

As mentioned above, by using the aluminum grid 240, a loss of active area 245 results because the aluminum grid 240 blocks the electrons landing on the aluminum grid 240 from reaching the depletion region of the p-n junction and will not be detected. Moreover, the aluminum grid 240 also creates a topography on the active area (e.g., variations in height on the surface of the detector 120) which may disturb the detection of the incoming electrons One alternative would be the formation of a "buried grid" or "buried portion" of the top electrode 250 (see e.g., FIG. 2B). The buried grid is expected to be a better solution than the aluminum grid 240 to reduce the series resistance of a photodiode with a boron layer (e.g., doped layer 230) because it would not cause a loss of the active or detection area 245, there would be no topography on the active area 245, and there no soft materials like aluminum would be used on the active area 245.

Figure 2B:
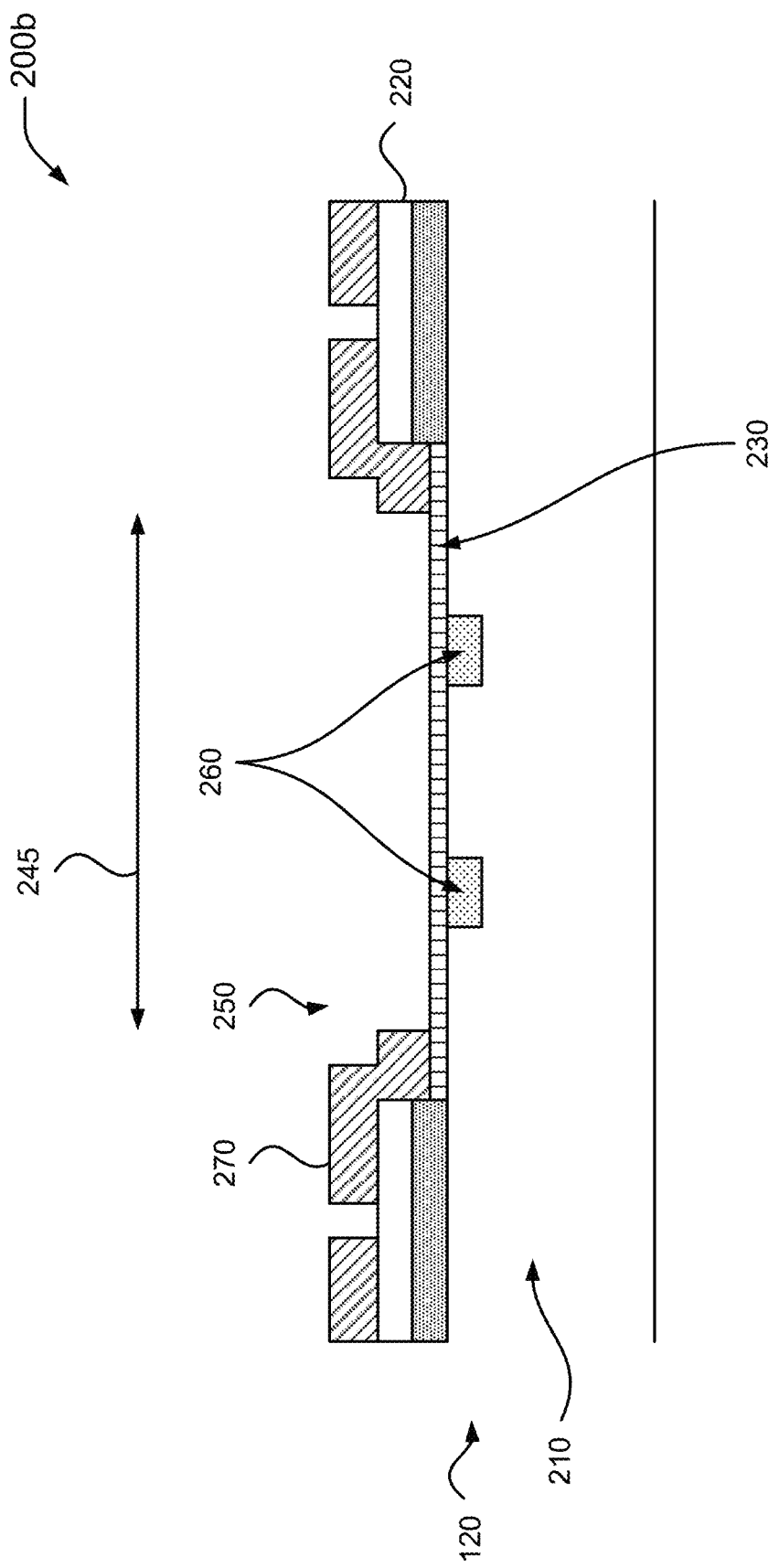
FIG. 2B is a diagram illustrating a partial cross-sectional view of a semiconductor detector with a buried portion of a top electrode, according to some aspects of the present disclosure.

FIG. 2B shows a diagram 200b illustrating a partial cross-sectional view of a semiconductor detector (e.g., the detector 120) with a buried portion 260 of a top electrode 250. In this example, there is not aluminum grid 240 as shown in the diagram 200a. Instead, the top electrode 250 includes the doped layer 230 (e.g., a boron layer or other layer with similar functionality) and the buried portion 260 beneath the doped layer 230, where the buried portion 260 is configured to reduce a series resistance of the top electrode 250 without changing the active area 245 provided for detection.

In aspects of one embodiment, for the semiconductor detector in FIG. 2B, the semiconductor structure 210 is a silicon-based semiconductor structure, the top electrode 250 is an anode electrode, and the doped layer 230 is doped with a p-type dopant. The buried portion 260 of the top electrode 250 is formed by a thermal treatment of a dopant of the same type as the doped layer 230 (see e.g., FIG. 6). Thus, in this case, the buried portion 260 of the top electrode 250 is a low resistivity (LR) p-type region while the semiconductor structure 210 is a high resistivity (HR) n-type layer. The dopant used to form the buried portion 260 of the top electrode 250 can be deposited onto the semiconductor structure 210 by various types of implantation processes, one of which can be a chemical vapor deposition (CVD) process. Moreover, as mentioned above, the p-type dopant of the doped layer 230 includes boron. In some implementations, the p-type dopant of the doped layer 230 may be a different element (or compound element or alloy), which may be at least partially selected from, for example, the same column of the periodic table as boron.

In aspects of another embodiment, for the semiconductor detector in FIG. 2B, the semiconductor structure 210 is again a silicon-based semiconductor structure, the top electrode 250 is now a cathode electrode, and the doped layer 230 is doped with a n-type dopant. In this embodiment, the doped layer 230 is not a boron layer since it is n-type doped but it plays the same or similar role as the boron layer does when the top electrode 250 is an anode electrode. The buried portion 260 of the top electrode 250 is again formed by a thermal treatment of a dopant of the same type as the doped layer 230 (see e.g., FIG. 6) and the dopant used to form the buried portion 260 of the top electrode 250 can also be deposited onto the semiconductor structure 210 by a CVD process. Thus, in this case, the buried portion 260 of the top electrode 250 is an LR n-type region while the semiconductor structure 210 is an HR p-type layer. The dopants of the same type used for the buried portion 260 of the top electrode 250 and the doped layer 230 can be different n-type dopants. Moreover, the n-type dopant of the doped layer 230 can include one or more of arsenic, phosphorus, or antimony.

It is to be understood from the diagrams 200a and 200b in FIGS. 2A and 2B, respectively, that top electrodes 250 can also include a top electrode metal contact 270 disposed over a perimeter of the semiconductor structure 210 and partially overlapping the doped layer 230 of the top electrode, wherein the buried portion 260 of the top electrode 250 enables current generated by the p-n junction from the detecting of the electrons (or electromagnetic radiation) to be available at the top electrode metal contact 270.

The objective of reducing the series resistance of the top electrode 250 could be achieved by, alternatively or additionally, capping the pure boron layer (e.g., doped layer 230) of the top electrode 250 (e.g., when the top electrode 250 is an anode electrode) with thin low resistivity (LR) layers and/or with a controlled top electrode (e.g., anode) doping drive-in. The corresponding reduction in the electron relative gain is expected to be negligible for the electron energy of interest and thus this approach should not impact collection efficiency in any significant manner. These three alternative options, that is, the use of a buried grid or buried portion, thin LR capping layers, and top electrode drive-in, can be used individually or in some combination to reduce the series resistance of the detector 120.

Figure 2C:
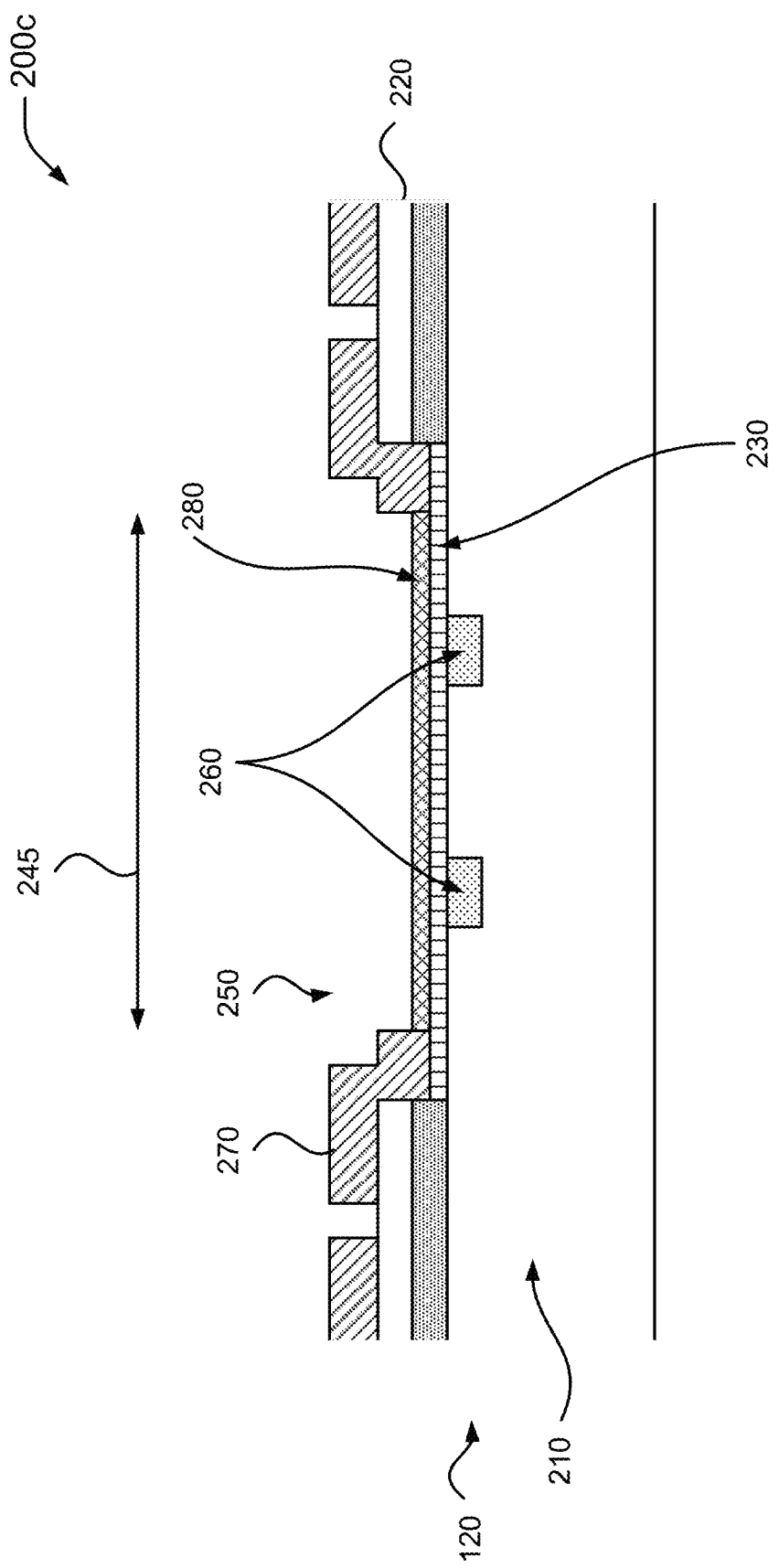
FIG. 2C is a diagram illustrating a partial cross-sectional view of a semiconductor detector with a buried portion of a top electrode and a capping layer, according to some aspects of the present disclosure.

FIG. 2C shows a diagram 200c illustrating a partial cross-sectional view of a semiconductor detector (e.g., the detector 120) with the buried portion 260 of the top electrode 250 and a capping layer 280. As shown in the diagram 200c, the capping layer 280, which may include one or more LR layers, is disposed over the doped layer 230. Moreover, the capping layer 280 can be made of a conductive material.

It is to be understood that each of the semiconductor detectors shown in FIGS. 2A-2C can be a secondary electron (SE) detector configured to detect secondary electrons and/or backscattered electrons from a target (e.g., the target 130), or can be a radiation detector configured to detect electromagnetic radiation produced by or backscattered from a target (e.g., the target 130).

Figure 3:
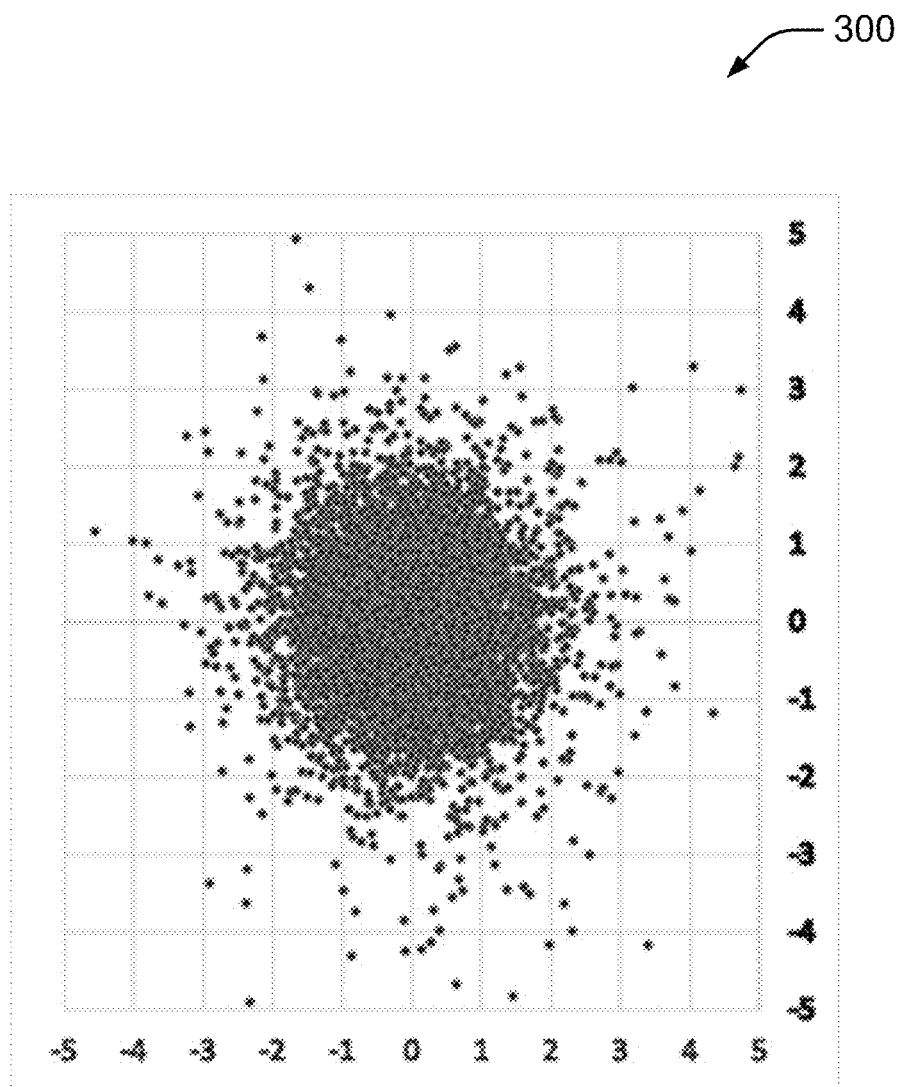
FIG. 3 is a plot of a simulated electron position distribution on a detector plane, according to some aspects of the present disclosure.

Another relevant aspect of this disclosure, which has a direct impact on the performance of the specific electron detector, is the extent of the "dead area" around the hole (e.g., the hole 125 in the diagram 100 in FIG. 1) through which a primary beam passes (e.g., the scanning beam 115). Ideally this dead region should be as small as possible since the secondary electron (SE) position distribution is heavily concentrated around the hole. FIG. 3 shows a plot 300 of a simulated electron position distribution on a detector plane where it is evident that most of the electrons arrive at the center of the detector and the larger the "dead area" around the hole is, the fewer the number of electrons that will be detected. Therefore, another aspect of this disclosure is to reduce as much as possible any "dead areas" in the detector 120 to improve its overall efficiency and/or sensitivity.

In existing semiconductor detector designs, a limit to the reduction of this "dead area" is the lateral extent of the deep depletion region required for fast response (e.g., reduced junction capacitance). In fact, it is best if the depletion layer does not reach the surface of the hole 125 to prevent a significant increase of the leakage current (e.g., in a segment of the detector 120 closest to the hole 125).

Figure 4A:
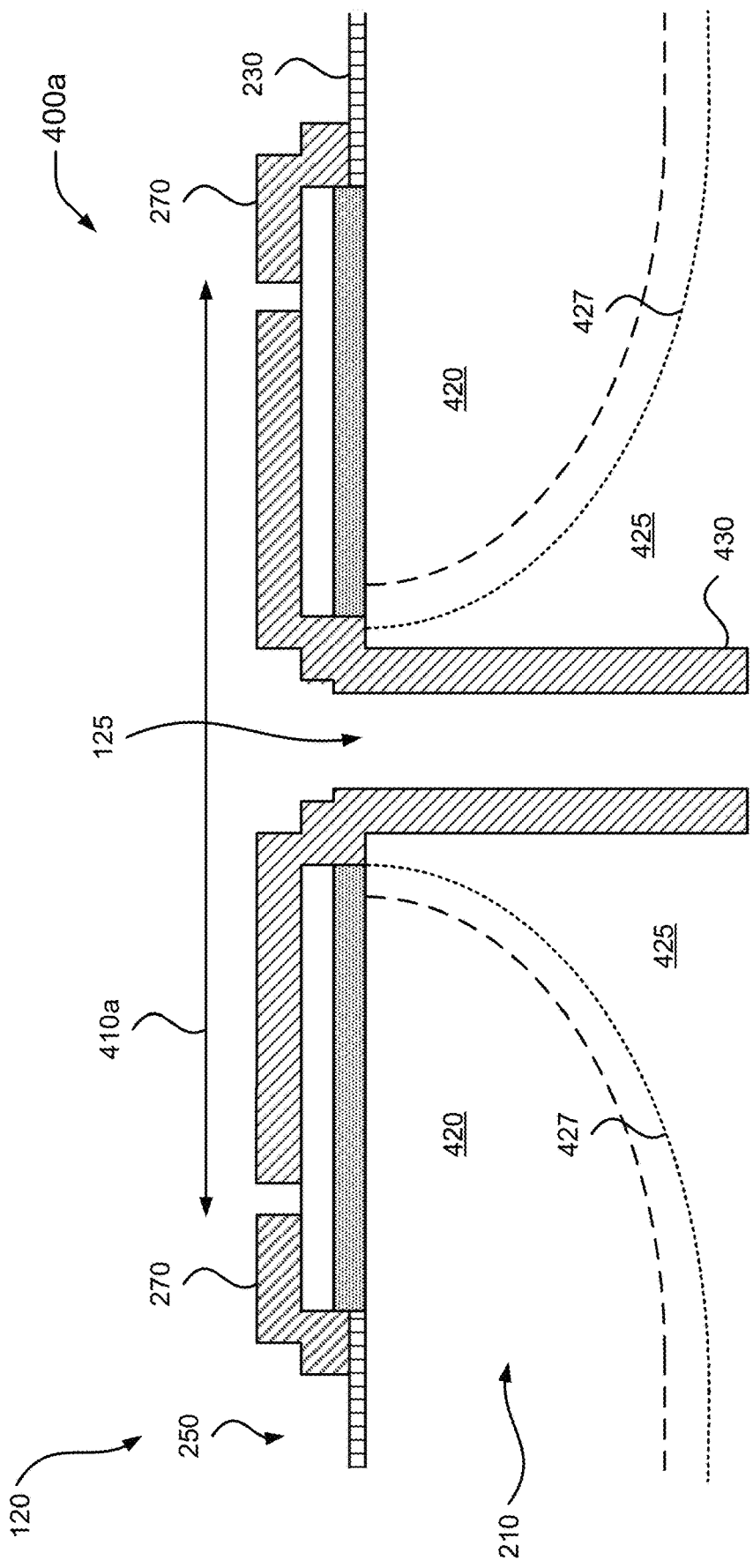
FIG. 4A is a diagram illustrating a partial cross-sectional view of a semiconductor detector with a large "dead area" around its hole, according to some aspects of the present disclosure.

FIG. 4A shows a diagram 400a illustrating a partial cross-sectional view of a semiconductor detector (e.g., the detector 120) with a large "dead area" 410a about the hole 125. The "dead area" 410a of this example covers the region between the top electrode metal contacts 270 of the top electrode 250, where this region includes the hole 125 and adjacent areas. In this example, a first layer 420 and a second layer 425 form a p-n junction that produces a depletion region 427 with a certain depletion length (e.g., depth or thickness of the depletion region 420) extending into the second layer 425 based on a reverse bias that is applied, where this depletion length is sufficiently large to lower the junction capacitance of the p-n junction in the semiconductor structure 210. This increases the response time and bandwidth of the semiconductor detector. In some implementations, the first layer 420 is a p-type doped layer and the second layer 425 is an n-type doped layer (e.g., a high resistivity n-type device layer), while in other implementations, the first layer 420 is an n-type doped layer and the second layer 425 is a p-type doped layer. The large depletion region 427, however, also extends laterally. In order to prevent it from reaching the sidewalls 430 of the hole 125, which would cause an increase in leakage current, the top electrode 250 is configured such that its active area begins far from the hole 125, thus creating the large "dead area" 410a found in existing semiconductor detector designs.

Figure 4B:
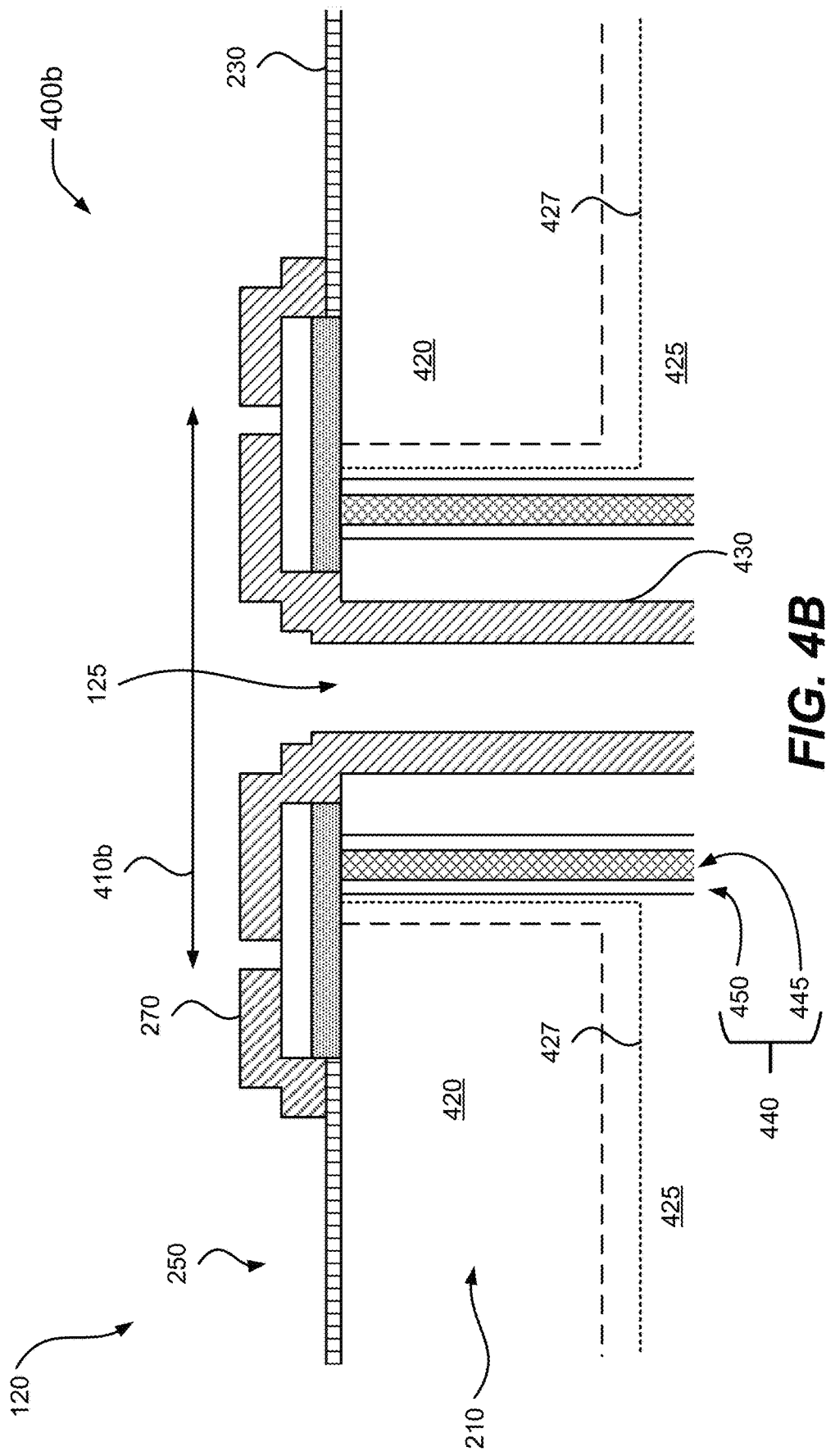
FIGS. 4B and 4C are diagrams illustrating a partial cross-sectional view of semiconductor detectors with an isolation structure to produce a small "dead area" around their hole, according to some aspects of the present disclosure.
Figure 4C:
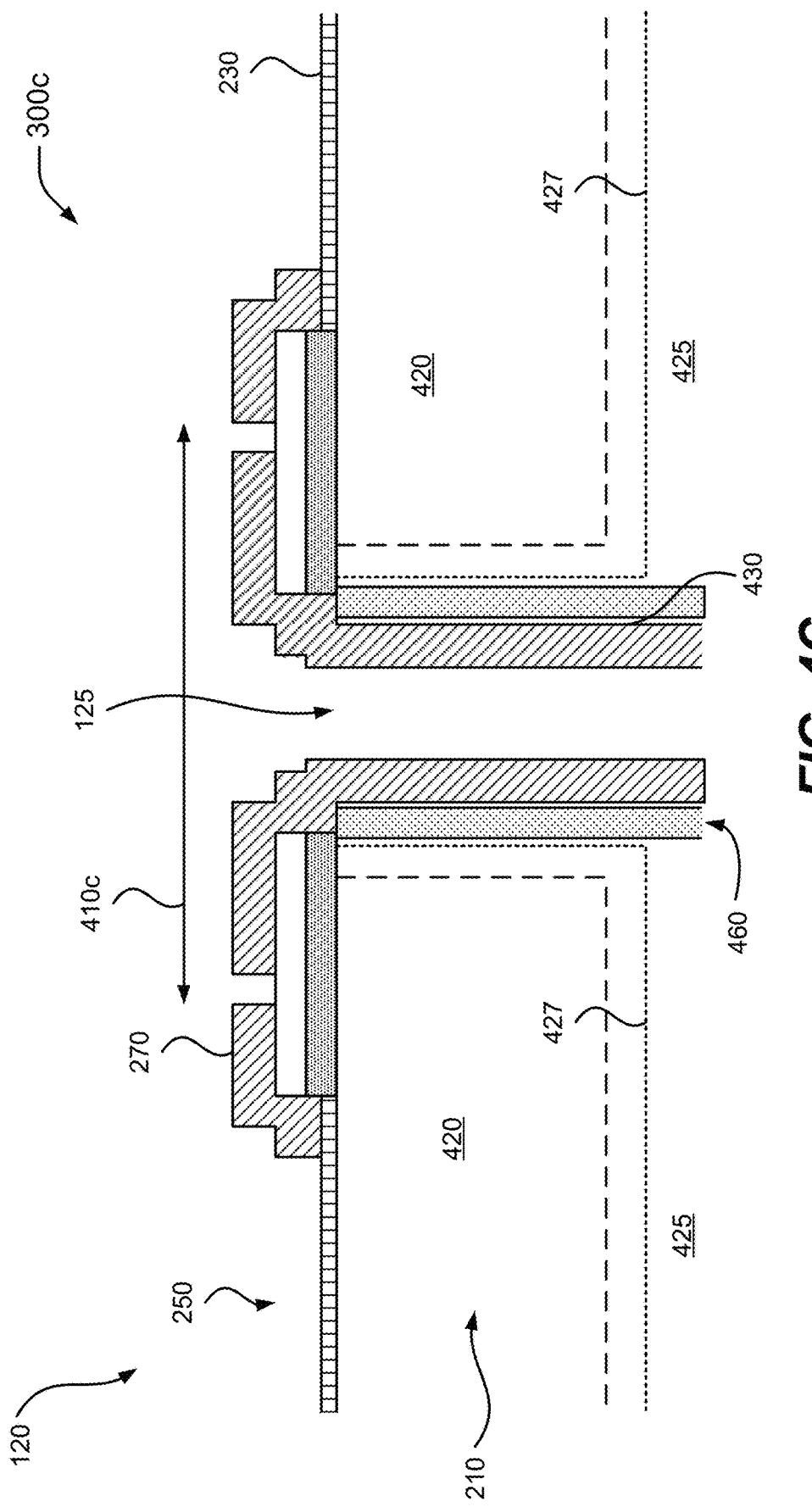

The present disclosure proposes a different approach that the one described in the diagram 400a. FIGS. 4B and 4C show diagrams 400b and 400c, respectively, that illustrate partial cross-sectional view of semiconductor detectors (e.g., the detector 120) with an isolation structure to produce a small, or smaller, "dead area" around their hole 125. For example, the "dead area" 410*b* in the diagram 400*b* and the "dead area" 410*c* in the diagram 400*c* are smaller than the "dead area" 410*a* in the diagram 400*a*.

For example, in the diagram 400*b*, an isolation structure 440 is included in the semiconductor structure 210 to isolate the depletion region(s) 427 from the sidewalls 430 of the hole 125. The isolation structure 440 is formed near the sidewalls 430 of the hole 125 and includes a deep trench 445 with doped sidewalls 450 to provide a defect free stopping plane that confines the lateral extension of the depletion region 420 in the direction of the hole 125. The deep trench 445 may be filled with, for example, an insulating material such as a dielectric material (e.g., oxide). The doping of the doped sidewalls 450 may be, for example, an opposite doping or doping type to that of the second layer 425. This allows the reduction of the "dead area" 410 between the hole 125 and the active area provided by the top electrode 250 to few tens of microns and, therefore, it is expected that having a smaller "dead area" 410 would provide a significant improvement in the detection of the secondary electrons and/or backscattered electrons (e.g. the electrons 135). In this example, a distance between the isolation structure 440 and the sidewalls 430 of the hole 125 can be less than 60 microns. Accordingly, the isolation structure 440 having the deep trench 440 and the sidewalls 450 can be substantially parallel to but not in contact with the sidewalls 430 of the hole 125.

In the diagram 400*c*, an isolation structure 460 is included in the semiconductor structure 210 to isolate the depletion region(s) 420 from the sidewalls 430 of the hole 125. The isolation structure 460 is formed very near the sidewalls 430 of the hole 125 and includes a doped layer that is substantially parallel to and adjacent to the sidewalls 430 of the hole 125 and that confines the lateral extension of the depletion region 427 in the direction of the hole 125. That is, the material, doping, and/or structural characteristics of the isolation structure 460 are configured to bound the lateral extension of the depletion region 427 as close as possible to the sidewalls 430 of the hole 125. This allows the reduction of the "dead area" 410*c* between the hole 125 and the active area provided by the top electrode 250 and improve the detection of the secondary electrons and/or backscattered electrons (e.g. the electrons 135). In this example, a distance between the isolation structure 460 and the sidewalls 430 of the hole 125 can be less than 1 micron. In some instances, however, the isolation structure 460 can be in direct contact with the sidewalls 430 of the hole 125.

As with the embodiments described above in connection with FIG. 2B, the semiconductor detectors (e.g., the detectors 120) in FIGS. 4B and 4C can have the semiconductor structure 210 be a silicon-based semiconductor structure, the top electrode 250 be an anode electrode, and the doped layer 230 be doped with a p-type dopant (e.g., boron), or alternatively, the semiconductor structure 210 be a silicon-based semiconductor structure, the top electrode 250 be a cathode electrode, and the doped layer 230 be doped with an n-type dopant (e.g., one or more of arsenic, phosphorus, or antimony). In each of these cases, the buried portion (not shown in FIGS. 4B and 4C) of the top electrode 250 can be formed by a thermal treatment of a dopant of the same type as the doped layer 230.

In addition to the various features described above, a semiconductor detector (e.g., the detector 120) can have multiple segments. In each segment, a new anode (or cathode) electrode is introduced with a position sensing functionality which will allow to have a resolution of the electrons collected by the same segment. Different resolution profiles can be used as described below.

Figure 5A:
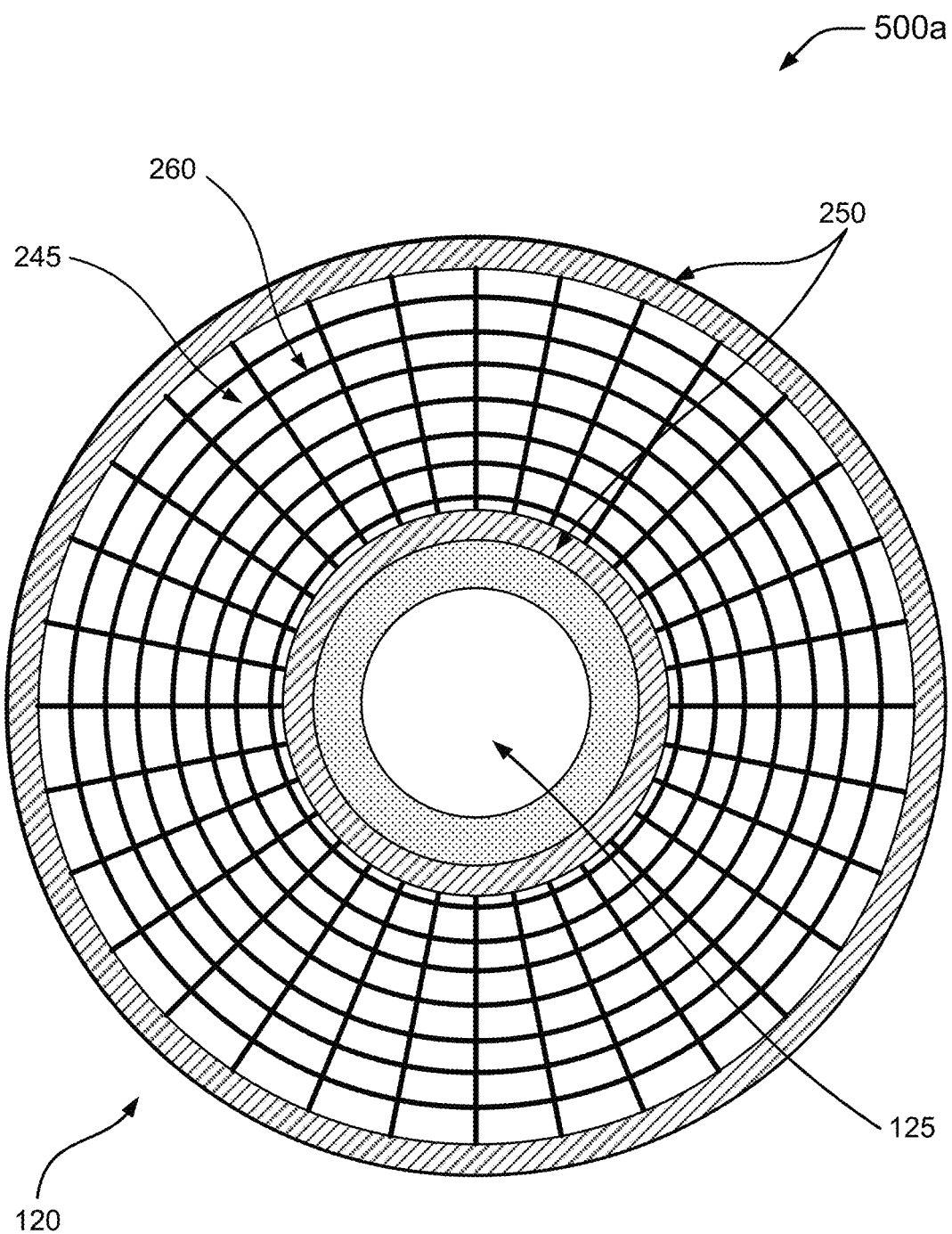
FIG. 5A is a diagram illustrating a top view of an example of the buried portion of a top electrode where multiple buried sections are arranged into a radial configuration, according to some aspects of the present disclosure.

For example, FIG. 5A shows a diagram 500*a* that illustrates a top view of an example of the buried portion 260 of the top electrode 250 where multiple buried sections are arranged into a radial configuration. That is, the buried portion 260 of the top electrode 250 includes multiple buried sections in the active area 245 provided by the top electrode 250 and these sections are arranged to form a radial configuration as shown in the diagram 500*a*.

Figure 5B:
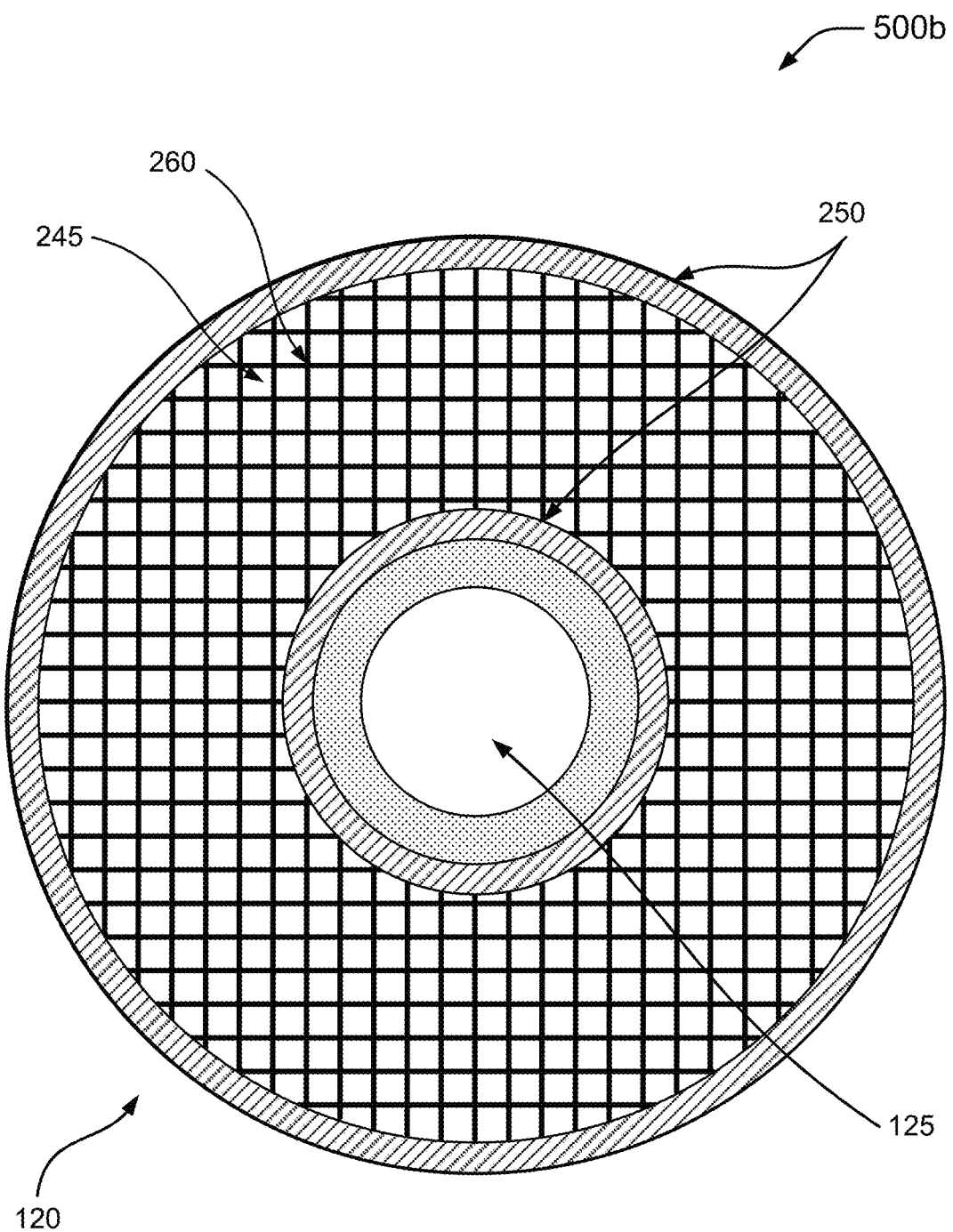
FIG. 5B is a diagram illustrating a top view of an example of the buried portion of a top electrode where multiple buried sections are arranged into a grid configuration, according to some aspects of the present disclosure.

In another example, FIG. 5B shows a diagram 500*b* that illustrates a top view of an example of the buried portion 260 of the top electrode 250 where multiple buried sections are arranged into a grid configuration. That is, the buried portion 260 of the top electrode 250 includes multiple buried sections in the active area 245 provided by the top electrode 250 and these sections are arranged to form a grid configuration as shown in the diagram 500*b*.

In other examples, the various sections that form the buried portion 260 of the tope electrode 250 need not cross each other as in the examples in the diagrams 500*a* (FIG. 5A) and 500*b* (FIG. 5B). For example, the various sections can include multiple lines (e.g., straight lines, curved lines) that do not overlap, cross over each other, and/or touch. Moreover, the various sections that form the buried portion 260 of the tope electrode 250 can include curved sections similar to those shown in the radial configuration of the diagram 500*a* (FIG. 5A), straight sections similar to those shown in the grid configuration of the diagram 500*b* (FIG. 5B), or a combination of both curved sections and straight sections.

The buried portion 260 of the top electrode 250, whether configured in a radial configuration, a grid configuration, or some other configuration, is formed by a thermal treatment of a dopant of the same type as the doped layer 230, where in some cases the dopants are the same but that need not always be the case (see e.g., description of FIG. 2B).

Figure 6:
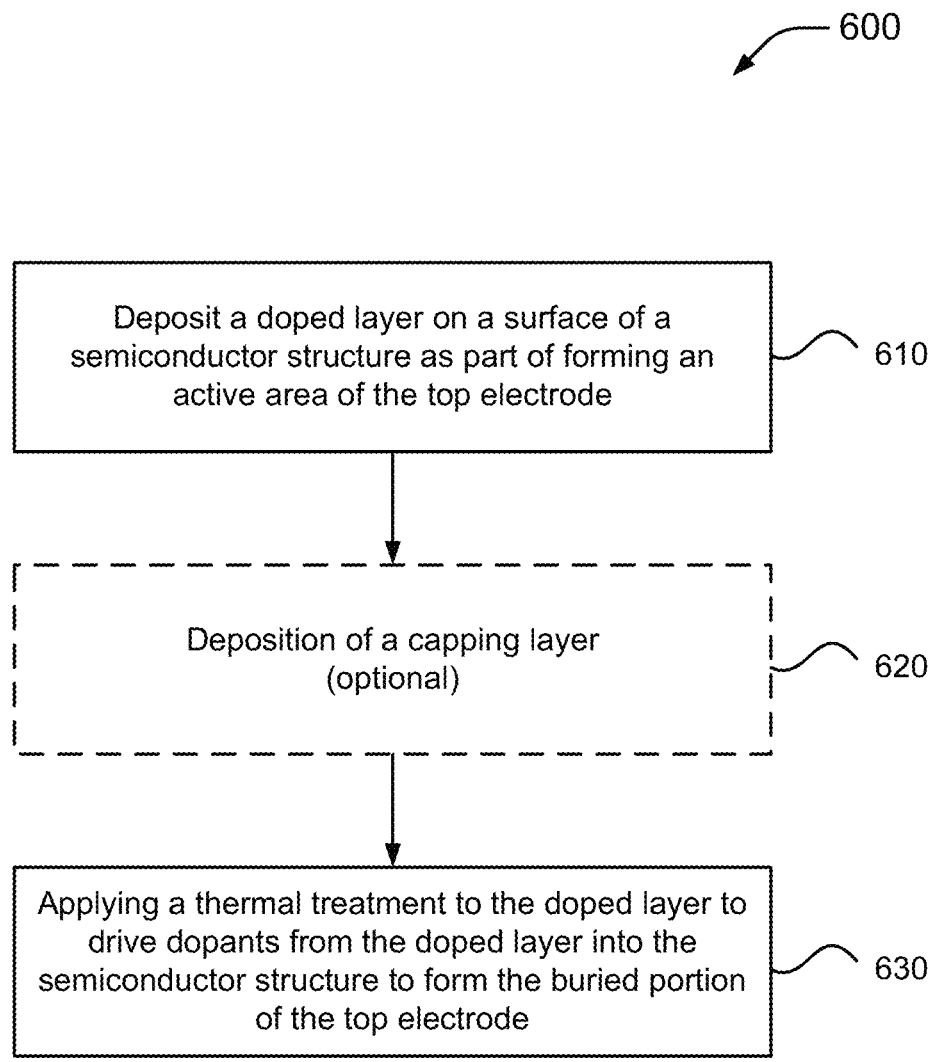
FIG. 6 is a flow diagram illustrating an example of a method of forming a buried portion of a top electrode in semiconductor detector, according to some aspects of the present disclosure.

FIG. 6 is a flow diagram illustrating an example of a method 600 of forming the buried portion 260 of the top electrode 250 in semiconductor detector (e.g., the detector 120).

The method 600 includes, at 610, depositing a dopant layer on a surface of a semiconductor structure (e.g., the semiconductor structure 210) having an active area (e.g., the active area 245) of the top electrode 250. The dopant layer being different from a doped layer such as the doped layer 230.

The method 600 optionally includes at 620 depositing a capping layer (e.g., the capping layer 280) over the dopant layer, wherein the capping layer is deposited prior to the application of the thermal treatment. Typically, the capping layer is a dielectric layer.

The method 600 includes at 630, applying a thermal treatment (e.g., heat treatment) to drive dopants from the dopant layer into the semiconductor structure and underneath a detecting layer (e.g., the doped layer 230) of the top electrode 250 to form the buried portion 260 of the top electrode 250.

In an aspect of the method 600, the depositing of the dopant layer includes depositing the dopant layer by a CVD process.

In another aspect of the method 600, the top electrode 250 can be an anode electrode and the dopants in the dopant layer can include p-type dopants (e.g., boron). Moreover, the dopants of the detecting layer can be of the same type as the dopants of the dopant layer.

In another aspect of the method 600, the top electrode 250 can be a cathode electrode and the dopants in the dopant layer can include n-type dopants (e.g., one or more of arsenic, phosphorus, or antimony). Moreover, the dopants of the detecting layer can be of the same type as the dopants of the dopant layer.

In another aspect of the method 600, the semiconductor detector can be an SE detector or a radiation detector.

In accordance with the description provided above in connection with FIGS. 1-6, an implementation supported by the disclosure includes a detector having a first layer of a first conductivity type (e.g., p-type doped layer) on a first side of a substrate to form an anode to receive secondary electrons of a scanning electron microscope (SEM) inspection system, a buried section (e.g., the buried portion 260) of the first conductivity type on the first side of the substrate to reduce a series resistance of the anode, and a second layer of a second conductivity type (e.g., n-type doped layer) to enable formation of a p-n diode that includes the first layer and the second layer. In another aspect of the implementation, the formation of the buried section can include implanting a dopant in the substrate, where the dopant can be boron, for example. Moreover, the buried section can form a grid (see e.g., FIG. 5A) or other configurations.

In yet another implementation supported by the disclosure, a substrate includes a semiconductor structure (e.g., the semiconductor structure 210) having a hole (e.g., the hole 125), where the semiconductor structure also has a deep trench isolation (e.g., the isolation structure 440) that encircles the hole, a first layer of a first conductivity type (e.g., p-type or n-type doped layer) on a first side of the semiconductor structure to receive secondary electrons of a SEM system; and a second layer of a second conductivity type (e.g., n-type or p-type doped layer) to enable formation in the semiconductor structure of a p-n diode that includes the first layer and the second layer, where the second layer is adjacent to the deep trench isolation.

As mentioned above, in an imaging system which detects backscattered electrons it is highly desirable to have a detector which can reliably and quickly detect the electrons. Such a detector would ideally combine on a single die the detector which detects the electrons, i.e., generates a signal in response to receiving the electrons, and the circuitry that receives the signals. There is a problem, however, in that to make the detector fast it is desirable to use a step in the fabrication process called HT PureB CVD, which stands for high temperature pure boron chemical vapor deposition. As its name implies, the step involves exposing the wafer on which the circuitry is formed to very high temperatures. It is also desirable to use a type of circuitry known as the CMOS circuitry. Unfortunately, these high temperatures exceed the temperatures that the CMOS circuitry can withstand. This has in the past represented a fundamental incompatibility. According to one of the disclosures herein, this fundamental incompatibility is resolved by dividing the formation of the circuitry into two parts: (1) a first part involving the creation only of structures that can survive later high temperature steps; and (2) a second part which is performed after the high-temperature steps in which structures which would not have survived the earlier high temperature steps can be safely fabricated. Thus, according to one aspect, HT PureB CVD processing steps are integrated in a standard BSI CMOS process, allowing the production of highly-sensitive, robust, radiation hard, very fast and power efficient detectors/imagers plus readout electronics. In other words, the resulting detector will have higher sensitivity, and faster response time, and a higher signal-to-noise ratio for optimal image quality. The process also permits providing more functionality within the detector.

In other words, as described, according to an aspect of an embodiment, an in-lens SE detector may be configured as a single silicon PIN detector with a center hole to let permit the primary electron beam to pass through. There is an aluminum coating on top of the diode surface to improve the series resistance as well as reflecting the stray light coming from laser beam scattering inside column. The SE detector is the first stage for the overall image channel and its signal-to-noise ratio (SNR) determines an upper limit of SNR for the rest of the channel.

There are techniques for using a Low-Temperature (LT) PureB process with a standard CMOS process for the production of a single-die imager for low-penetration-depth radiation such as EUV/DUV photons and low-energy electrons See U.S. Pat. No. 9,331,117, issued May 3, 2016 and titled "Sensor and Lithographic Apparatus," the disclosure of which is hereby incorporated by reference in its entirety. The integration of a LT PureB process with standard CMOS process permits the creation of a multi-pixel detector (imager) on a single die, for imaging low-penetration-depth radiation. However, the LT PureB process is characterized with a very high sheet resistance, which does not allow high-speed imaging.

There is a technical demand for an extremely fast pixelized radiation detector capable of detecting low-energy (low penetration-depth) electrons. One solution for creating such a detector is to combine the HT PureB process together with a standard CMOS process, on a single silicon die. The HT PureB process provides a shallow p-n junction for detecting any low-penetration-depth particles: charged and non-charged, like DUV and EUV photons, for example, or low-energy electrons for which the PureB technology (CVD boron deposition on crystalline silicon) is beneficial high readout speed, and a thin and dense protection and passivation amorphous boron layer on top of silicon. Locating the CMOS readout electronic circuits on the same silicon die as the radiation responsive element makes the signal paths short, reduces parasitic resistance and capacitance, and enables power-efficient and very fast signal processing.

One technical challenge to achieving these benefits, however, is that the temperature for chemical vapor deposition (CVD) of boron on silicon in the HT PureB process is typically above 700° C. Such a temperature could destroy the CMOS part, if it is processed first.

According to an aspect of an embodiment, the technical challenge is overcome by dividing the CMOS processing of the die into two parts: (1) a first part to be performed before the HT CVD of pure boron and (2) a second part to be performed after the HT CVD of pure boron. The CMOS structures created before the HT CVD boron are selected to be those that can withstand further die processing at temperatures up to 800° C. Next, the HT PureB CVD process is realized (for example, at about 750° C.), followed by the remaining, high temperature intolerant steps of the CMOS process. In this way, the sequence of wafer processing steps with respect to temperature may be arranged so that each step uses lower temperatures than the previous steps.

One way to realize such a processing sequence uses temporary wafer bonding-debonding. An example of an overall processing sequence for single-die CMOS image sensors (CIS) with integrated HT CVD of boron using temporary wafer bonding-debonding is shown in FIG. 7.

The process starts with an initial structure 700 which is a starting wafer W1. Next, initial CMOS processing 702 is performed on one surface of the starting wafer W1 to arrive at intermediate structure 710. This initial CMOS processing can include the steps of forming CMOS circuitry that will tolerate the high-temperature CVD steps carried out later the process. For example, this initial CMOS processing can be up to and including the formation of polysilicon gates. Next, a first bonding wafer BW1 is bonded to the portion of starting wafer W1 having the initial CMOS structures 702 to arrive at intermediate structure 720. Next, the portion of initial wafer W1 except for the CMOS structures 702 is etched away to form intermediate structure 730. Next, a boron layer 742 is deposited on the CMOS layer 702 using HT PureB CVD to form intermediate structure 740. Next, a second bonding wafer BW2 is bonded to the boron layer 742 to arrive at intermediate structure 750. Next the first bonding wafer BW1 is debonded from the CMOS layer 702 to form intermediate structure 760. Then the second portion of the CMOS processing is performed to create CMOS structure layer 772 and so to arrive at intermediate structure 770. Then a third bonding wafer BW3 is bonded to CMOS structure layer 772 to arrive at the intermediate structure 780. Finally, the bonding layer BW2 is debonded from the boron layer 742 to arrive at the final structure 790. It will be understood that this final structure may undergo additional processing steps. For each bonding/debonding step a proper bonding/debonding technique has to be chosen with respect to the appropriate thermal processing sequence before and after the bonding/debonding step.

Figure 7:
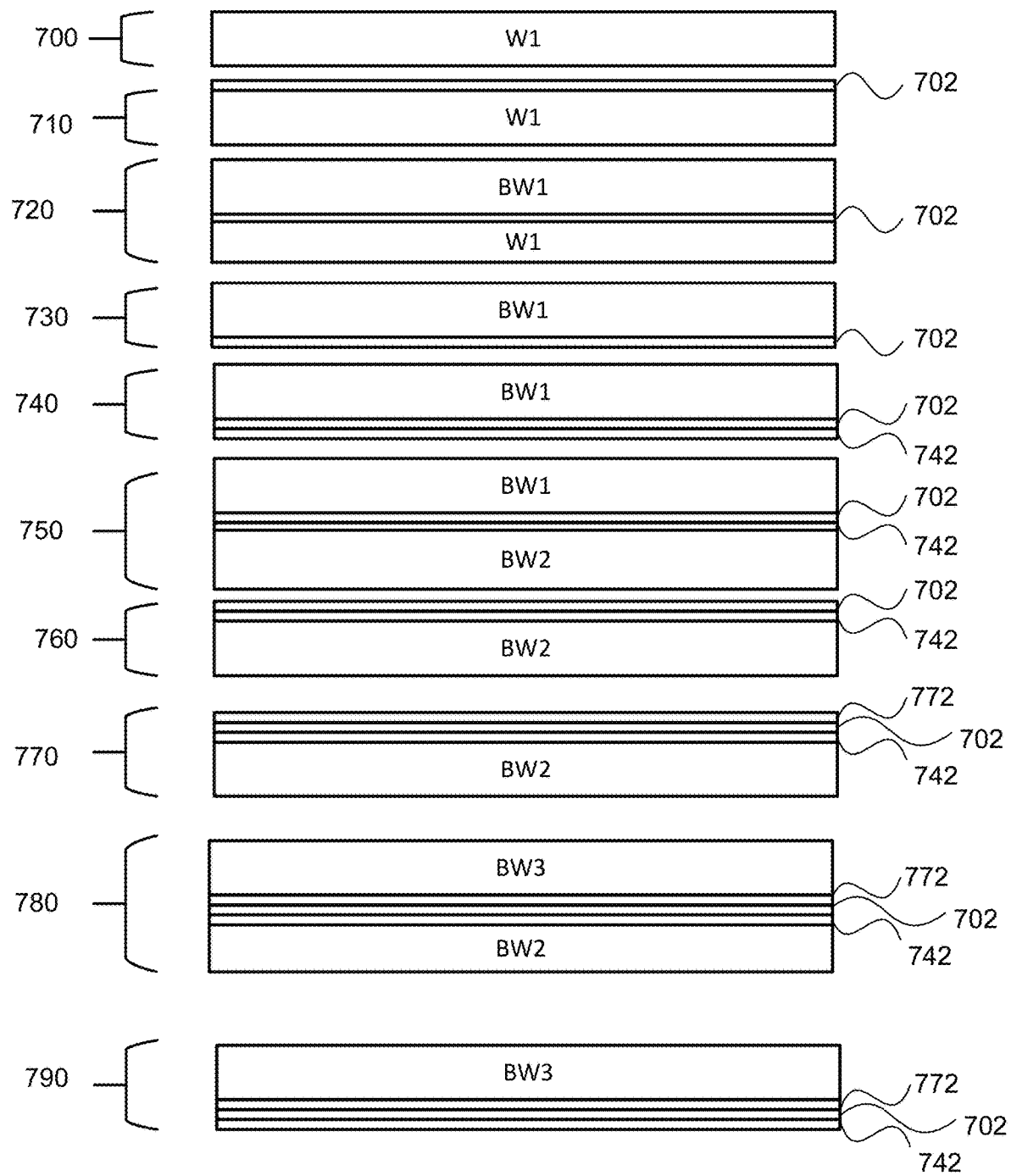
FIG. 7 is a chart illustrating an example of a method of forming a semiconductor detector, according to some aspects of the present disclosure.
Figure 8A:
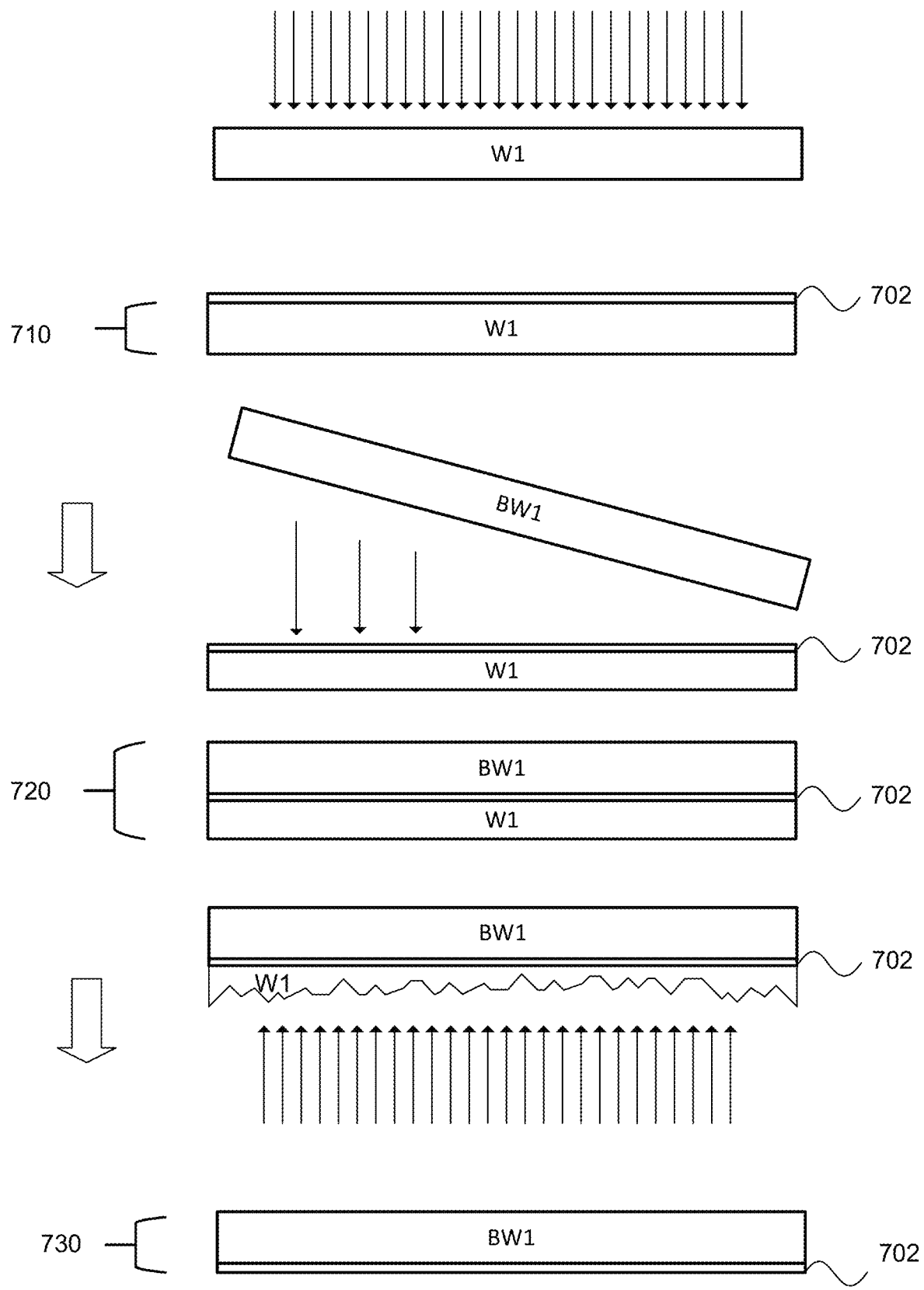
FIGS. 8A-8D are charts illustrating an example of a method of forming a semiconductor detector, according to some aspects of the present disclosure.

FIGS. 8A-8D show the overall process of FIG. 7 in more detail. The topmost portion of FIG. 8A shows initial CMOS processing 702 applied to one surface of the starting wafer W1 to arrive at intermediate structure 710. This initial CMOS processing can include the steps of forming CMOS circuitry that will tolerate a high-temperature CVD step carried out later the process. For example, this initial CMOS processing can be up to and including the formation of polysilicon gates. The next portion of FIG. 8A proceeding downward in the figure shows a first bonding wafer BW1 being bonded to the portion of starting wafer W1 having the initial CMOS structures 702 to arrive at intermediate structure 720. The next portion of FIG. 8A proceeding downward shows the portion of initial wafer W1 except for the CMOS layer 702 being etched away to form intermediate structure 730.

Figure 8B:
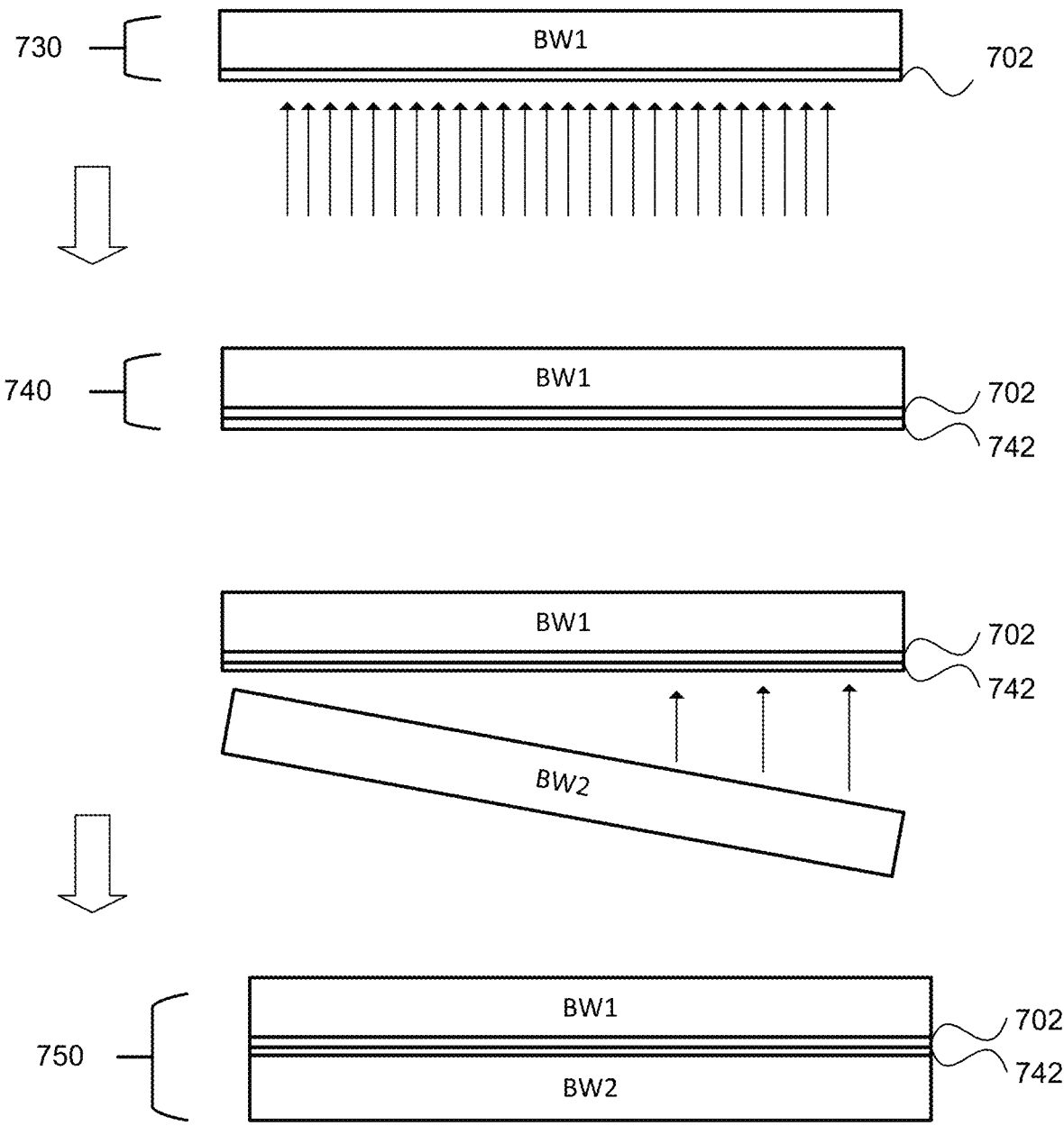

Turning to FIG. 8B, the topmost portion of FIG. 8B shows a boron layer 742 being deposited on the CMOS layer 702 using HT PureB CVD to form intermediate structure 740. The next portion of FIG. 8B proceeding downward in the figure shows a second bonding wafer BW2 being bonded to the boron layer 742 to arrive at intermediate structure 750.

Figure 8C:
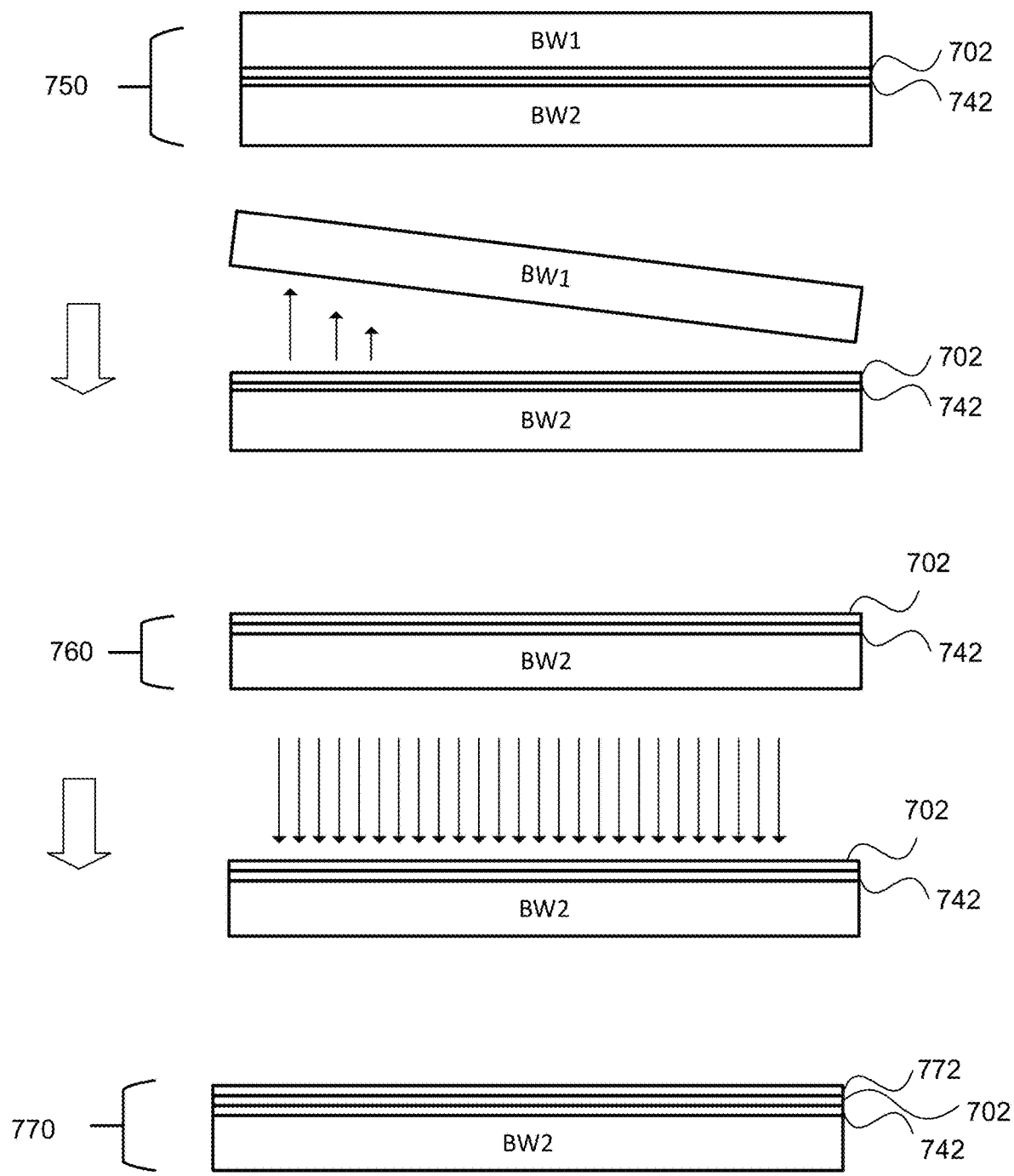

Turning to FIG. 8C, the topmost portion of FIG. 8C shows the first bonding wafer BW1 being debonded from the CMOS layer 702 to form intermediate structure 760. The next portion of FIG. 8C proceeding downward in the figure shows the second portion of the CMOS processing is performed to create CMOS structure layer 772 and so to arrive at intermediate structure 770.

Figure 8D:
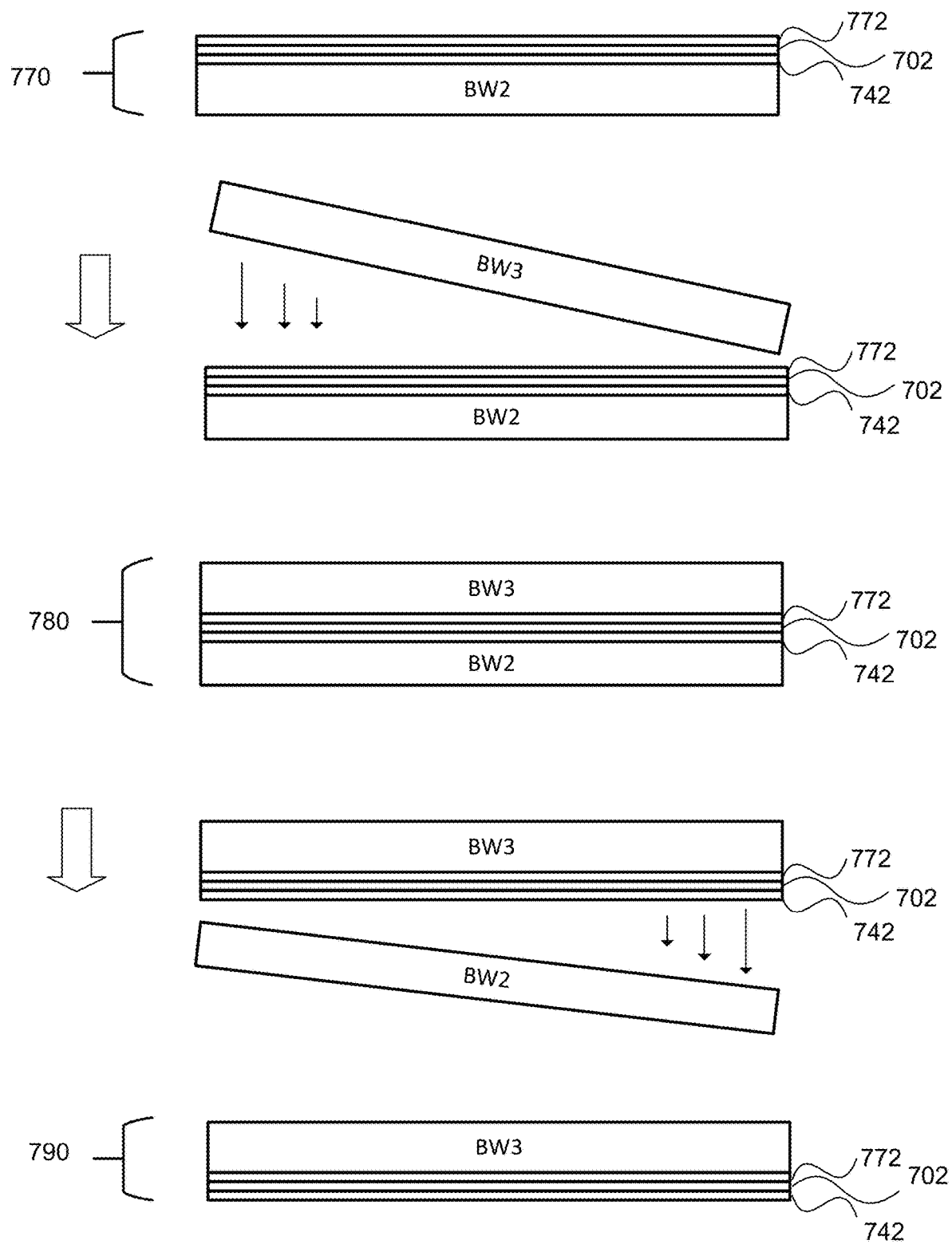

The topmost portion of FIG. 8D shows a third bonding wafer BW3 being bonded to CMOS structure layer 772 to arrive at the intermediate structure 780. Finally, the second bonding wafer BW2 is debonded from the boron layer 742 to arrive at the final structure 790.

Figure 9:
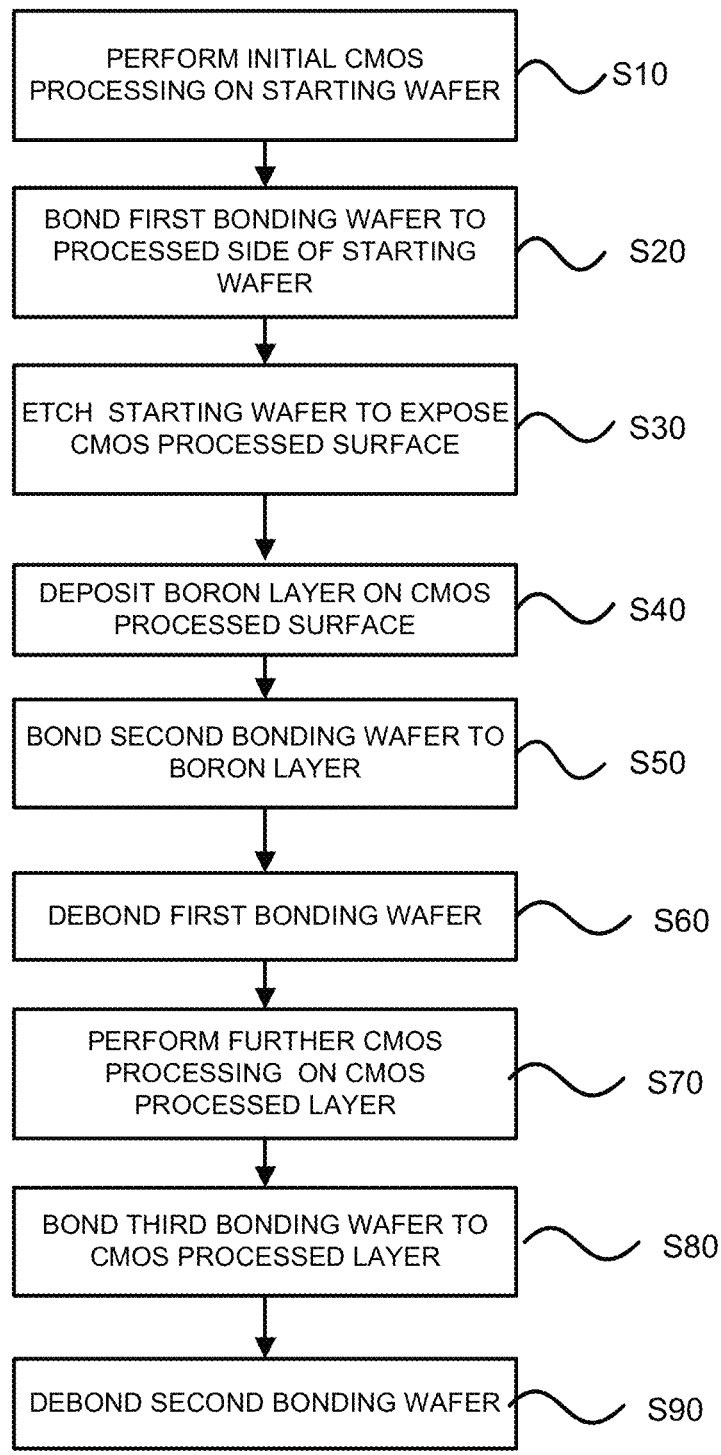
FIG. 9 is a flow diagram illustrating an example of a method of forming a semiconductor detector, according to some aspects of the present disclosure.

FIG. 9 is a flowchart showing the steps of a process for making single-die CMOS detectors using temporary wafer bonding-debonding according to one aspect of an embodiment. In a step S10 initial CMOS processing is performed on the starting wafer. This processing is carried out for forming only structures that will tolerate the high heat of later steps, in particular, a high-temperature CVD deposition step. In a step S20 a first bonding wafer is bonded to the processed sides of the starting wafer. In a step S30 the starting wafer is etched to expose the partially CMOS processed surface. In a step S40 a layer of a material such as pure boron is deposited on the CMOS process surface using, for example, HT PureB CVD. In a step S50 a second bonding wafer is bonded to the boron layer. In a step S60 the first bonding wafer is debonded from the combination of the second bonding wafer and its layers. In step S70 additional CMOS processing is performed on the CMOS process layer. In this step structures which would not tolerate a high temperature step such as HT PureB CVD can be formed because such steps have already been performed. In step S80 a third bonding wafer is bonded to the CMOS processed layer. In a step S90 the second bonding wafer is debonded from the combination of the third body wafer with its layers.

The embodiments may further be described using the following clauses:

1. A detector comprising:
   a semiconductor structure having a p-n junction; and
   a top electrode for the p-n junction, the top electrode providing an active area for detecting electrons or electromagnetic radiation, the top electrode including a doped layer and a buried portion at least partially beneath the doped layer, the buried portion being configured to reduce a series resistance of the top electrode.

2. The detector of clause 1, wherein:
   the detector is configured for in-lens or on-axis operation in a scanning electron microscope (SEM) inspection system, and
   the semiconductor structure has a hole through which a scanning beam is passed to a target.

3. The detector of clause 1, wherein the buried portion is configured to reduce the series resistance of the top electrode without changing the active area provided for detection.

4. The detector of clause 1, wherein:
   the semiconductor structure is a silicon-based semiconductor structure,
   the top electrode is an anode electrode, and
   the doped layer is doped with a p-type dopant.

5. The detector of clause 4, wherein the buried portion of the top electrode is formed by a thermal treatment of a dopant of the same type as the doped layer.

6. The detector of clause 5, wherein the dopant used to form the buried portion of the top electrode is deposited onto the semiconductor structure by a chemical vapor deposition process.

7. The detector of clause 4, wherein the p-type dopant of the doped layer includes boron.

8. The detector of clause 1, wherein:
   the semiconductor structure is a silicon-based semiconductor structure,
   the top electrode is a cathode electrode, and
   the doped layer is doped with a n-type dopant.

9. The detector of clause 8, wherein the buried portion of the top electrode is formed by a thermal treatment of a dopant of the same type as the doped layer.

10. The detector of clause 9, wherein the dopant used to form the buried portion of the top electrode is deposited onto the semiconductor structure by a chemical vapor deposition process.

11. The detector of clause 9, wherein the dopants of the same type for the buried portion of the top electrode and the doped layer are different n-type dopants.

12. The detector of clause 8, wherein the n-type dopant of the doped layer includes one or more of arsenic, phosphorus, or antimony.

13. The detector of clause 1, further comprising atop electrode metal contact disposed over a perimeter of the semiconductor structure and partially overlapping the doped layer of the top electrode, wherein the buried portion of the top electrode reduces the series resistance of the top electrode to facilitate current generated by the p-n junction from the detecting of the electrons or the electromagnetic radiation to be available at the top electrode metal contact.

14. The detector of clause 1, further comprising a capping layer disposed over the doped layer.

15. The detector of clause 14, wherein the capping layer is a conductive layer.

16. The detector of clause 1, wherein the p-n junction is a p-i-n junction.

17. The detector of clause 1, wherein:
the detector is a secondary electron (SE) detector and the detecting of the electrons includes the detecting of backscattered electrons from the target, or
the detector is a radiation detector and the detecting of the electromagnetic radiation includes the detecting of backscattered electromagnetic radiation from the target.

18. The detector of clause 1, wherein the buried portion of the top electrode includes multiple buried sections in the active area provided by the top electrode.

19. The detector of clause 18, wherein the multiple buried sections do not cross each other.

20. The detector of clause 19, wherein the multiple buried sections include straight sections, curved sections, or both.

21. The detector of clause 19, wherein the multiple buried sections are arranged into a grid configuration.

22. The detector of clause 19, wherein the multiple buried sections are arranged into a radial configuration.

23. The detector of clause 1, wherein the detector is configured for off-axis operation in an SEM inspection system.

24. A detector comprising:
a semiconductor structure having a hole through which a scanning beam is passed to a target, the semiconductor structure having a p-n junction;
a top electrode for the p-n junction, the top electrode providing an active area for detecting electrons or electromagnetic radiation, and the top electrode including a doped layer; and
an isolation structure formed in the semiconductor structure near sidewalls of the hole and configured to electrically isolate the active area from the sidewalls of the hole.

25. The detector of clause 24, wherein the hole is formed at a center of the semiconductor structure.

26. The detector of clause 24, wherein the isolation structure is configured to electrically isolate the active area from the sidewalls of the hole by being configured to confine a depletion region formed by the p-n junction from reaching the sidewalls of the hole.

27. The detector of clause 24, wherein a distance between the isolation structure and the sidewalls of the hole is less than 60 microns.

28. The detector of clause 24, wherein the isolation structure is a deep trench structure that is substantially parallel to but not in contact with the sidewalls of the hole.

29. The detector of clause 28, wherein the deep trench structure includes doped sidewalls and provides a defect free stopping plane to electrically isolate the active area by confining a depletion region formed by the p-n junction from reaching the sidewalls of the hole.

30. The detector of clause 24, wherein the isolation structure is a doped layer that is substantially parallel to and adjacent to the sidewalls of the hole.

31. The detector of clause 30, wherein a distance between the isolation structure and the sidewalls of the hole is less than 1 micron.

32. The detector of clause 30, wherein the doped layer is in contact with the sidewalls of the hole.

33. The detector of clause 24, wherein:
the semiconductor structure is a silicon-based semiconductor structure,
the top electrode is an anode electrode, and
the doped layer is doped with a p-type dopant.

34. The detector of clause 33, wherein the p-type dopant of the doped layer includes boron.

35. The detector of clause 24, wherein:
the semiconductor structure is a silicon-based semiconductor structure,
the top electrode is a cathode electrode, and
the doped layer is doped with a n-type dopant.

36. The detector of clause 35, wherein the n-type dopant of the doped layer includes one or more of arsenic, phosphorus, or antimony.

37. The detector of clause 24, wherein the p-n junction is a p-i-n junction.

38. The detector of clause 24, wherein:
the detector is a secondary electron (SE) detector and the detecting of the electrons includes the detecting of backscattered electrons from the target, or
the detector is a radiation detector and the detecting of the electromagnetic radiation includes the detecting of backscattered electromagnetic radiation from the target.

39. The detector of clause 24, wherein the detector is configured for in-lens or on-axis operation in a scanning electron microscope (SEM) inspection system.

40. A detector comprising:
a semiconductor structure having a hole through which a scanning beam is passed to a target, the semiconductor structure having a p-n junction;
a top electrode for the p-n junction, the top electrode providing an active area for detecting electrons or electromagnetic radiation, the top electrode including a doped layer and a buried portion at least partially beneath the doped layer, the buried portion being configured to reduce a series resistance of the top electrode without changing the active area being provided for the detecting of the backscattering; and
an isolation structure formed in the semiconductor structure near sidewalls of the hole and configured to electrically isolate the active area from the sidewalls of the hole.

41. The detector of clause 40, wherein the hole is formed at a center of the semiconductor structure.

42. The detector of clause 40, wherein:
the semiconductor structure is a silicon-based semiconductor structure,
the top electrode is an anode electrode,
the doped layer is doped with a p-type dopant, and
the buried portion of the top electrode is formed by a thermal treatment of a dopant of the same type as the doped layer.

43. The detector of clause 42, wherein the dopant used to form the buried portion of the top electrode is deposited onto the semiconductor structure by a chemical vapor deposition process.

44. The detector of clause 42, wherein the p-type dopant of the doped layer includes boron.

45. The detector of clause 40, wherein:
the semiconductor structure is a silicon-based semiconductor structure,
the top electrode is a cathode electrode,
the doped layer is doped with a n-type dopant, and
the buried portion of the top electrode is formed by a thermal treatment of a dopant of the same type as the doped layer.

46. The detector of clause 45, wherein the dopant used to form the buried portion of the top electrode is deposited onto the semiconductor structure by a chemical vapor deposition process.

47. The detector of clause 45, wherein the dopants of the same type for the buried portion of the top electrode and the doped layer are different n-type dopants.

48. The detector of clause 45, wherein the n-type dopant of the doped layer includes one or more of arsenic, phosphorus, or antimony.

49. The detector of clause 40, wherein the isolation structure is:
a deep trench structure with doped sidewalls that is substantially parallel to but not in contact with the sidewalls of the hole, or
a doped layer that is substantially parallel to and adjacent to the sidewalls of the hole.

50. The detector of clause 40, wherein:
the detector is a secondary electron (SE) detector and the detecting of the electrons includes the detecting of backscattered electrons from the target, or
the detector is a radiation detector and the detecting of the electromagnetic radiation includes the detecting of backscattered electromagnetic radiation from the target.

51. The detector of clause 40, wherein the detector is configured for in-lens or on-axis operation in a scanning electron microscope (SEM) inspection system.

52. A method of forming a buried portion of a top electrode in semiconductor detector, the method comprising:
depositing a dopant layer on a surface of a semiconductor structure having an active area of the top electrode; and
applying a thermal treatment to drive dopants from the dopant layer into the semiconductor structure and at least partially underneath a detecting layer of the top electrode for forming the buried portion of the top electrode, the buried portion of the top electrode including multiple buried sections that reduce a series resistance of the top electrode.

53. The method of clause 52, wherein forming the multiple buried sections includes forming:
multiple buried section that do not cross each other,
multiple buried sections that include straight sections, curved sections, or both,
multiple buried sections arranged into a grid configuration, or
multiple buried sections are arranged into a radial configuration.

54. The method of clause 52, wherein the depositing of the dopant layer includes depositing the dopant layer by a chemical vapor deposition process.

55. The method of clause 52, further comprising depositing a capping layer over the dopant layer, wherein the capping layer is deposited prior to the application of the thermal treatment.

56. The method of clause 52, wherein the capping layer is a dielectric layer.

57. The method of clause 52, wherein:
the top electrode is an anode electrode, and
the dopants in the dopant layer include p-type dopants.

58. The method of clause 57, wherein the p-type dopants include boron.

59. The method of clause 57, wherein dopants of the detecting layer are of the same type as the dopants of the dopant layer.

60. The method of clause 52, wherein:
the top electrode is a cathode electrode, and
the dopants in the doped layer include n-type dopants.

61. The method of clause 60, wherein the n-type dopants include one or more of arsenic, phosphorus, or antimony.

62. The method of clause 60, wherein dopants of the detecting layer are of the same type as the dopants of the dopant layer.

63. The method of clause 52, wherein:
the detector is a secondary electron (SE) detector configured to detect electrons over the active area, or
the detector is a radiation detector configured to detect electromagnetic radiation over the active area.

64. A detector comprising:
a first layer of a first conductivity type on a first side of a substrate to form an anode to receive secondary electrons of a scanning electron microscope (SEM) inspection system;
a buried section of the first conductivity type on the first side of the substrate to reduce a series resistance of the anode; and
a second layer of a second conductivity type to enable formation of a p-n diode that includes the first layer and the second layer.

65. The detector of clause 64, wherein formation of the buried section includes implanting a dopant in the substrate.

66. The detector of clause 65, wherein the dopant includes boron.

67. The detector of clause 64, wherein the buried section forms a grid.

68. A substrate comprising:
a semiconductor structure that includes a hole, the semiconductor structure including deep trench isolation that encircles the hole;
a first layer of a first conductivity type on a first side of the semiconductor structure to receive secondary electrons of a SEM system; and
a second layer of a second conductivity type to enable formation in the semiconductor structure of a p-n diode that includes the first layer and the second layer, wherein the second layer is adjacent to the deep trench isolation.

69. A method of making a semiconductor detector, the semiconductor detector comprising an element for generating a signal in response to receiving radiation and circuitry electrically connected to the element, the circuitry including at least one structure incapable of withstanding a processing temperature in excess of a temperature T, the method comprising the steps of:
fabricating a first portion of the circuitry, the first portion being capable of withstanding the temperature T;

performing a processing step at the temperature T; and fabricating a second portion of the circuitry, the second portion including structures incapable of withstanding the temperature T.

70. The method of clause 69 wherein performing a processing step at the temperature T comprises performing high temperature chemical vapor deposition.

71. The method of clause 70 wherein performing high temperature chemical vapor deposition comprises performing high temperature chemical vapor deposition of boron.

72. The method of clause 71 wherein performing high temperature chemical vapor deposition of boron comprises high temperature chemical vapor deposition of pure boron.

73. The method of any one of clauses 69-72 wherein fabricating a first portion of the circuitry comprises partial fabrication of CMOS circuitry.

74. The method of any one of clauses 69-73 wherein fabricating a second portion of the circuitry comprises completing fabrication of CMOS circuitry.

75. The method of any one of clauses 69-74 wherein the temperature T is above 700° C.

76. A method of making a semiconductor detector, the semiconductor detector comprising an element for generating a signal in response to receiving radiation and CMOS circuitry electrically connected to the element, the CMOS circuitry including at least one structure incapable of withstanding a processing temperature T in excess of 700° C., the method comprising the steps of:

fabricating a first portion of the CMOS circuitry, the first portion being capable of withstanding the temperature T;

performing an HT PureB CVD processing step at the temperature T; and fabricating a second portion of the CMOS circuitry, the second portion including structures incapable of withstanding the temperature T.

77. A process for making a single-die semiconductor detector, the process comprising the steps of:

providing a starting wafer;

performing a first partial circuit formation step on a processed side of the starting wafer to form a first partial circuit layer, the first partial circuit formation step being limited to formation of circuitry capable of withstanding a processing temperature T;

bonding a first bonding wafer to the first partial circuit layer;

etching away a portion of the starting wafer to expose the first partial circuit layer;

depositing a layer of boron on the first partial circuit layer;

bonding a second bonding wafer to the boron layer;

debonding the first bonding wafer from the first partial circuit layer;

performing a second partial circuit formation step on the first partial circuit layer to form a completed circuit layer, the second partial circuit formation step comprising forming circuit structures incapable of withstanding the processing temperature T;

bonding a third bonding layer to the completed circuit layer; and debonding the second bonding wafer from the boron layer.

78. The process of clause 77 wherein performing a first partial circuit formation step comprises performing a first partial CMOS circuit formation step.

79. The process of any one of clauses 77 or 78 wherein performing a second partial circuit formation step on first partial circuit layer to form a completed circuit layer comprises performing a second partial CMOS circuit formation step on the first partial circuit layer to form a completed the CMOS circuit layer.

80. The process of any one of clauses 77-79 wherein depositing a layer of boron on the first partial circuit layer comprises using HT PureB CVD.

81. The process of any one of clauses 77-80 wherein the temperature T is above 700° C.

82. A single-die semiconductor detector comprising an element for generating a signal in response to receiving radiation and CMOS circuitry electrically connected to the element, the CMOS circuitry including at least one structure incapable of withstanding a processing temperature T in excess of 700° C., the semiconductor detector being fabricated by a method comprising the steps of:

fabricating a first portion of the CMOS circuitry, the first portion being capable of withstanding the temperature T;

performing an HT PureB CVD processing step at the temperature T; and fabricating a second portion of the CMOS circuitry, the second portion including structures incapable of withstanding the temperature T.

This disclosure, which includes FIGS. 1-9 and their respective descriptions, provides various techniques that improve the sensitivity, efficiency, and bandwidth of semiconductor detectors used in SEM systems. For example, this disclosure describes the use of a "buried grid" or "buried portion" of a top electrode combined with pure boron technology (e.g., a pure boron layer or similar layer for cathode electrodes) to achieve low noise and high speed response in electron detection, where no filtering/absorbing metal stacks (e.g., aluminum grid 240 is used in the active area (as is the case in extreme ultraviolet, EUV, applications). Moreover, this disclosure describes the use of isolation structures to maximize the active area as well as new positioning resolutions (e.g., radial configuration) of the incoming electrons within a segment of the semiconductor detector.

The various diagrams described in connection with the figures illustrate examples of the architecture, arrangement, functionality, and operation of possible implementations of the various embodiments. With respect to the flow diagrams, each block may represent a portion of an overall method or process. It should also be noted that, in some alternative implementations, the functions noted in the blocks of a flow diagram may occur out of the order noted and/or concurrently with the functions of a different block.

It is to be understood that the described embodiments are not mutually exclusive, and elements, components, materials, or steps described in connection with one example embodiment may be combined with, or eliminated from, other embodiments in suitable ways to accomplish desired design objectives.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Additionally, the articles "a" and "an" as used in this application and the appended claims should generally be construed to mean "one or more" unless specified otherwise or clear from context to be directed to a singular form.

The use of figure numbers or figure reference labels in the claims is intended to facilitate the interpretation of the claims. Such use is not to be construed as necessarily limiting the scope of those claims to the embodiments or implementations shown in the corresponding figures.

It will be further understood that various changes in the details, materials, and arrangements of the parts which have been described and illustrated in order to explain the nature of described aspects or embodiments may be made by those skilled in the art without departing from the scope as expressed in the following claims.

The invention claimed is:

1. A detector comprising:
a semiconductor structure having a p-n junction; and
a top electrode for the p-n junction, the top electrode providing an active area for detecting electrons or electromagnetic radiation, the top electrode including a doped layer and a buried portion at least partially beneath the doped layer, the buried portion being configured to reduce a series resistance of the top electrode, wherein the buried portion comprises a plurality of buried sections arranged in a grid configuration or a radial configuration.

2. The detector of claim 1, wherein:
the detector is configured for in-lens or on-axis operation in a scanning electron microscope (SEM) inspection system, and
the semiconductor structure has a hole through which a scanning beam is passed to a target.

3. The detector of claim 1, wherein the buried portion is configured to reduce the series resistance of the top electrode without changing the active area provided for detection.

4. The detector of claim 1, wherein:
the semiconductor structure is a silicon-based semiconductor structure, the top electrode is an anode electrode, and the doped layer is doped with a p-type dopant.

5. The detector of claim 4, wherein the buried portion of the top electrode is formed by a thermal treatment of a dopant of the same type as the doped layer.

6. The detector of claim 5, wherein the dopant used to form the buried portion of the top electrode is deposited onto the semiconductor structure by a chemical vapor deposition process.

7. The detector of claim 4, wherein the p-type dopant of the doped layer includes boron.

8. The detector of claim 1, wherein:
the semiconductor structure is a silicon-based semiconductor structure, the top electrode is a cathode electrode, and the doped layer is doped with a n-type dopant.

9. The detector of claim 8, wherein the buried portion of the top electrode is formed by a thermal treatment of a dopant of the same type as the doped layer.

10. The detector of claim 9, wherein the dopant used to form the buried portion of the top electrode is deposited onto the semiconductor structure by a chemical vapor deposition process.

11. The detector of claim 9, wherein the dopants of the same type for the buried portion of the top electrode and the doped layer are different n-type dopants.

12. The detector of claim 8, wherein the n-type dopant of the doped layer includes one or more of arsenic, phosphorus, or antimony.

13. The detector of claim 1, further comprising a top electrode metal contact disposed over a perimeter of the semiconductor structure and partially overlapping the doped layer of the top electrode, wherein the buried portion of the top electrode reduces the series resistance of the top electrode to facilitate current generated by the p-n junction from the detecting of the electrons or the electromagnetic radiation to be available at the top electrode metal contact.

14. The detector of claim 1, further comprising a capping layer disposed over the doped layer.

15. The detector of claim 14, wherein the capping layer is a conductive layer.

* * * * *